(12) United States Patent
Bright et al.

(10) Patent No.: US 7,426,067 B1
(45) Date of Patent: Sep. 16, 2008

(54) ATOMIC LAYER DEPOSITION ON MICRO-MECHANICAL DEVICES

(75) Inventors: Victor M. Bright, Boulder, CO (US); Jeffrey Elam, Boulder, CO (US); Francois Fabreguette, Boulder, CO (US); Steven M. George, Boulder, CO (US); Nils Hoivik, Boulder, CO (US); Yung-Cheng Lee, Boulder, CO (US); Ryan Linderman, Boulder, CO (US); Marie Tripp, Boulder, CO (US)

(73) Assignee: Regents of the University of Colorado, Boulder, CO (US)

( * ) Notice: Subject to any disclaimer, the term of this patent is extended or adjusted under 35 U.S.C. 154(b) by 0 days.

(21) Appl. No.: 10/322,195

(22) Filed: Dec. 17, 2002

Related U.S. Application Data

(60) Provisional application No. 60/385,225, filed on May 31, 2002, provisional application No. 60/341,486, filed on Dec. 17, 2001.

(51) Int. Cl.
*G02B 26/08* (2006.01)
(52) U.S. Cl. .................................. 359/223; 359/900
(58) Field of Classification Search ................ 359/223, 359/872
See application file for complete search history.

(56) References Cited

U.S. PATENT DOCUMENTS

| | | | |
|---|---|---|---|
| 4,389,973 A | 6/1983 | Suntola et al. |
| 5,500,761 A | 3/1996 | Goossen et al. |
| 5,661,592 A | 8/1997 | Bornstein et al. |
| 5,739,945 A | 4/1998 | Tayebati |
| 5,746,826 A | 5/1998 | Hasegawa et al. |
| 5,774,252 A | 6/1998 | Lin et al. |
| 6,108,121 A | 8/2000 | Mansell et al. |
| 6,270,572 B1 | 8/2001 | Kim et al. |
| 6,287,965 B1 | 9/2001 | Kang et al. |
| 6,290,859 B1 | 9/2001 | Fleming et al. |
| 6,296,779 B1 | 10/2001 | Clark et al. |
| 6,297,072 B1 | 10/2001 | Tilmans et al. |
| 6,299,300 B1 | 10/2001 | Silverbrook |
| 6,300,156 B1 | 10/2001 | Decker et al. |

(Continued)

FOREIGN PATENT DOCUMENTS

WO WO 2004/094695 11/2004

OTHER PUBLICATIONS

J.D. Ferguson, A. W. Weimer and S. M. George, "Atomic Layer deposition of ultrathin and conformal $Al_2O_3$ films and BN Particles". Thin Solid Films 371 (2000) 95-104.

(Continued)

*Primary Examiner*—Euncha P Cherry
(74) *Attorney, Agent, or Firm*—Gary C Cohn, PLLC

(57) ABSTRACT

A micro-electromechanical device or MEMS having a conformal layer of material deposited by atomic layer deposition is discussed. The layer may provide physical protection to moving components of the device, may insulate electrical components of the device, may present a biocompatible surface interface to a biological system, and may otherwise improve such devices. The layer may also comprise a combination of multiple materials each deposited with great control to allow creating layers of customizable properties and to allow creating layers having multiple independent functions, such as providing physical protection from wear and providing electrical insulation.

15 Claims, 24 Drawing Sheets

U.S. PATENT DOCUMENTS

| | | | |
|---|---|---|---|
| 6,300,619 | B1 | 10/2001 | Aksyuk et al. |
| 6,303,014 | B1 | 10/2001 | Taylor et al. |
| 6,303,885 | B1 | 10/2001 | Hichwa et al. |
| 6,307,169 | B1 | 10/2001 | Sun et al. |
| 6,307,452 | B1 | 10/2001 | Sun |
| 6,324,192 | B1 | 11/2001 | Tayebati |
| 6,503,330 | B1 | 1/2003 | Sneh et al. |
| 6,638,859 | B2 | 10/2003 | Sneh et al. |
| 6,716,737 | B2 | 4/2004 | Plas et al. |
| 6,766,817 | B2 | 7/2004 | da Silva |
| 7,015,138 | B2* | 3/2006 | Pan et al. .................. 438/653 |
| 2001/0026859 | A1 | 10/2001 | Nakamura |
| 2003/0064149 | A1 | 4/2003 | Miller |
| 2003/0106490 | A1 | 6/2003 | Jallepally et al. |
| 2004/1178175 | | 9/2004 | Pellin |

OTHER PUBLICATIONS

B.S. Berland, I. P. Garland, A.W. Ott and S.W. George, In Situ Monitoring of Atomic Layer Controlled Pore Reduction in Alumina Tubular Membranes Using Sequential Surface Reactions. Chem. Matter, 1998, 10, pp. 3941-3950.

A.W. Ott, J.W, Klaus, J.M. Johnson and S.M. George, "$Al_3O_3$ thin film growth on Si (100) using binary reaction sequence chemistry", Thin Solid Films 292, (1997) pp. 135-144.

M. Ritala, M. K. Leskla, J. Dekkar, C. Mutsaers, P.J. Soininen, J. Sharp, "Growth of titanium dioxide thin films atomic layer epitaxy", Thin Solid Films, 225 (1993) pp. 288-295.

J.W. Klaus, A.W. Ott, A.C. Dillon and S.M. George, "Atomic Layer controlled growth of $Si_3N_4$ films using sequential surface reactions", Surface Science 418 (1998) L14-L19.

M. Ritala, M. Leskela, E. Rauhala and P. Haussalo, "Atomic Layer Epitaxy Growth of TiN Thin Films", J. Electrochem Soc. vol. 142, No. 8, Aug. 1995. pp. 2731-2737.

Per Martensson and Jan Otto Carlsson, "Atomic Layer Epitaxy of Copper, Growth and Selectivley in the Cu(II)-2,2,6,6-tetramethyl-3, 5-heptanedionate/H2 Process". J. Electrochem. Soc., vol. 145, No. 8, Aug. 1998, pp. 2926-2931.

J.W. Klaus, S. J. Ferro and S.M. George, "Atomic Layer Deposition of Tungsten Using Sequential Surface Chemistry With a Sacrificial Stripping Reaction". Thin Solid Films 360 (2000) pp. 145-153.

K. Peterson, P. Tangyunyong and A. Pimentel, "Failure Analysis for Surface-Micromachined Microengines", SPIE Conference on Materials and Device Characterization in Micromachining. Sep. 1998, SPIE vol. 3512, pp. 190-200.

R. Matero, et al. "Atomic layer deposited thin films for corrosion protection", J. Phys. IV France 9 (1999). pp. 493-499.

M. Ritala and M. Leskela, "Atomic Layer Epitaxy—A Valuable Tool for Nanotechnology?", Nanotechnology 10 (1999) pp. 19-24.

Goldsmith, "Special Issues on RF Application of MEMS and Micromachining", Int'l Journal of RF and Microwave Computer-Aided Engineering, vol. 11, No. 5. pp. 252-253, 2001.

D. J. Nagel and M. E. Zaghloul, MEMS Micro Technology, Mega Impact. Circuits & Devices, Mar. 2001. pp. 14-25.

J. H. Comtois and V.M. Bright, "Surface Micromachined Polysilicon Thermal Actuator Arryas and Applications", Soilid-State Sensor and Actuator Workshop Hilton Head, South Carolina, Jun. 2-6, 1996. pp. 174-177.

N. Hoivik, et al., "Digitally Controllable Variable High-Q MEMS Capacitor for RF Applications", IEEE MTT-S 2001 International Microwave Symposium, Pheonix, AZ, May 20-25, 2001. Symposium Digest, pp. 2115-2118.

K. H. Harsh, et al. "Flip-Chip Assembly for SI-Based RF MEMS". Proceedings of the 12th IEEE IMMS Conference, Florida, Jan. 17, 1999. pp. 1-6.

R.S. Irwin, et al., "Quick Prototyping of Flip Chip Assembly with MEMS", Proceedings of 44th International Instrumentation Symposium, Reno, Nevada, May 3-7, 1998. pp. 256-261.

S. M. George, A.W. Ott and J.W. Klaus, "Surface Chemistry for Atomic Layer Growth", J. Phys. Chem. 1996, 100. pp. 13121-131231.

C.R. Stoldt, et al. "Novel Low-Temperature CVD Process for Silicon Carbide MEMS" pp. 984-987.

R. Maboudian, et al., "Self-Assembled Monolayers as Anti-Stiction Coatings for MEMS: Characteristics and Recent Developments", Sensors and Actuators 82 (2000). pp. 219-223.

R. J. Linderman, et al., "The Resonant Micro Fan For Fluidic Transport, Mixing and Particle Filtering", Proceedings of 2001 ASME International Mechcanical Engineering Congress and Exposition, Nov. 11-16, 2001, New York, NY. pp. 1-8. IMECE2001/MEMS-23868.

M. Ritala, et al., "Perfectly Conformal TiN and $Al_2O_3$ Films and Deposited by Atomic Layer Deposition", Chem. Vapor Deposition, 1999, 5, No. 1. pp. 7-9.

J. J. Yao, "RF MEMS from a Device Perspective", Journal of Micromechanics and Microengineering-structues, devices and systems, 10 (2000) R9-R38.

S.S. Mani et al., "Effect of W Coating on Microengine Performance", IEEE 00CH37059, 38th Annual International Reliability Physics Symposium, San Jose, CA, 2000. pp. 146-151.

M.F. Bain et al., "Characterization of CVD Tungsten Deposited by Silane Reduction". pp. 327-331. 2001.

Tuomo Suntola, "Atomic Layer Epitaxy", Thin Solid Films, 216 (1992). pp. 84-89.

H. Nathanson, et al., "The Resonant Gate Transistor". pp. 21-37. Reprinted from IEEE Transactions on Electron Devices, vol. ED-14, No. 3, pp. 117-133, Mar. 1967.

J.W. Klaus et al., "Atomically controlled Growth of Tungsten and Tungsten Nitride using Sequential Surface Reactions", Applied Surface Science 162-163 (2000). pp. 479-791.

Charles Goldsmith et al., "RF MEMS Variable Capacitors for Tunable Filters", Raytheon Systems Corporation, Received Jul. 27, 1998; revised Dec. 30, 1998. pp. 362-374.

Zhiping Feng et al., "Design and Modeling of RF MEMS Tunable Capacitors Using Electro-thermal Actuators", CAMPmode, 1999 IEEE MTT-S Digest. pp. 1507-1510.

M. Adrain Michalicek ,et al., "Micromirror arrays fabricated by flip-chip assembly". SPIE Conference on Minaturaized Systems with Micro-Optics and MEMS. Santa Clara, CA, Sep. 1999, SPIE vol. 3878. pp. 68-79.

Aleksander Dec, et al., "Micromachined Electro-Mechanically Tunable Capacitors and Their Applications to RF IC's". © 1998 IEEE Transactions On Microwave Theory and Techniques, vol. 46., No. 12, Dec. 1998. pp. 2587-2596.

Shin-ichi Zaitsu, et al., "Optical thin films consisting of nanoscale laminated layers", Applied Physics Letters, vol. 80, No. 14, Apr. 8, 2002. pp. 2442-2444.

G. Vdovin et al., "Technology and applications of micromachined adaptive mirrors", J. Micromech., Microeng. 9 (1999) R8-R19.

Gleb Vdovin et al., "Flexible mirror micromachined in silicon", Applied Optics, vol. 34, No. 16, Jun. 1, 1995. pp. 2968-2972.

Geun-Young Yoon, et al., "High aspect-ratio line focus for an x-ray laser by a deformable mirror", Applied Optics, vol. 36, No. 4, Feb. 1, 1997. pp. 847-852.

Ch. Morawe ands H. Zabel[a]), "Metal/$Al^2O^3$: A new class of x-ray mirrors". J. Appl. Physics 80 (7), Oct. 1, 1996. pp. 3639-3645.

M.Ishii[a] et al., "Atomic layer epitaxy of AIP and its application to X-ray multilayer mirror", Journal of Crystal Growth 180 (1997). pp. 5-21.

Troy W. Barbee, Jr., et al., "Molybdenum-silicon multilayer mirrors for the extreme ultraviolet". Applied Optics, vol. 24., No. 6, Mar. 15, 1985. pp. 883-886.

Sakaue, et al. "Mo-Si Multilayered Films For Soft X-Ray Mirrors", Thin Solid Films, 201 (1991) pp. 155-165.

Willaim H. Southwell, "Coating design using very thin high and low -index layers". Applied Optics, vol. 24.. No. 4, Feb. 15, 1985. pp. 457-460.

Hiroshi Kumagai[a]) et al., "Titanium oxide/aluminum oxide multilayer reflectors for "water-window" wavelengths", Appl. Phys. Lett. 70 (18), May 5, 1997. pp. 2338-23340.

Markku Leskela et al., "Atomic layer deposition (ALD): from precursors to thin film structures," Thin Solid Films, 409 (2002). pp. 138-146.

Genus, Genus Announces ALD Marketing Strategy for Non-Semiconductor Applications. Sunnyvale, California, Sep. 14, 2000. [online] Retrieved on Feb. 6, 2003. Retrieved from the Internet at: http://www.genus.com/news/press/archive/091400.htm. pp. 1-2.

Non-Semiconductor—Genus. Markets—Non-Semiconductor [online] Retrieved on Feb. 6, 2003. Retrieved from the Internet at: http://www.genus.com/markets/markets_nonsemicon.html. pp. 1-2.

Solid State Technology—semiconductor manufacturing and wafer fabrication.CVD tungsten extends MEMS lifetime by order of magnitude. [online] Retrieved on Oct. 23, 2001. Retrieved from the Internet at http://sst.pennnet.com/Articles/Article_Display.cfm?Section+Archives&Subsection=Display&Article_ID=76736. pp. 1-2.

John L. Speier, et al., "Synthesis of (3-Aminoalkyl)silicon Compounds", J. Org. Chem., vol. 36, No. 21, 1971, pp. 3120-3126.

J.W. Elam, et al., "ZnO/Al$_2$O$_3$ nanolaminates fabricated by atomic layer deposition: growth and surface roughness measurements", Thin Solid Films 414 (2002) pp. 43-55.

Matthew G. Hankins, et al., "Vapor Deposition of Amino-Functionalized Self-Assembled Monolayers on MEMS", Proc. of SPIE vol. 4980, pp. 238-247.

W. Robert Ashurst, et al., "Vapor Phase Anti-Stiction Coatings for MEMS", IEEE Transactions on Device and Materials Reliability, vol. 3, No. 4, Dec. 2003, pp. 173-178.

W. Robert Ashurst, et al., "Wafer level anti-stiction coating for MEMS", Science Direct®, Sensors and Actuators A 104 (2003) pp. 213-221.

W. Robert Ashurst, et al., "Dichlorodimethylsilane as an Anti-Stiction Monolayer for MEMS: A Comparison to the Octadecyltrichlosilane Self-Assembled Monolayer", Journal of Microelectromechanical Systems, vol. 10, No. 1, Mar. 2001, pp. 41-49.

M.P. De Boer, et al., "Adhesion Hysteresis of Silane Coated Microcantilevers", Pergamon, Acta mater. 48 (2000) pp. 4531-4541.

B.C. Bunker, et al., "The Impact of Solution Agglomeration on the Deposition of Self-Assembled Monolayers", Langmuir 2000, 16, pp. 7742-7751.

Uthara Srinivasan, et al., "Alkyltrichlorosilane-Based Self-Assembled Monolayer Films for Stiction Reduction in Silicon Micromachines", Journal Of Microelectromechanical Systems, vol. 7, No. 2, Jun. 1998, pp. 252-260.

T.M. Mayer, et al., "Chemical vapor deposition of fluoroalkylsilane monolayer films for adhesion control in microelectromechanical systems", J. Vac. Sci. Technol. B 18(5), Sep./Oct. 2000, pp. 2433-2440, © American Vacuum Society.

Nils D. Hoivik, et al., "Atomic layer deposited protective coatings for micor-electromechanical systems", Sensors and Actuators A 103 (2003) pp. 100-108.

M.D. Groner, et al., "Electrical Characterization of thin Al$_2$O$_3$ films grown by atomic layer deposition on silicon and various metal sbstrates", Thin Solid Films 413 (2002) pp. 186-197.

J.W. Elam, et al., "Viscous flow reactor with quartz crystal microbalance for thin film growth by atomic layer deposition", Review of Scientific Instruments. vol. 73, No. 8, Aug. 2002, pp. 2981-2987.

A.C. Dillion, et al., "Surface chemistry of Al$_2$O$_3$ deposition using Al(CH$_3$)$_3$ and H$_2$O in a binary reaction sequence", Surface Science 322 (1995) pp. 230-244.

J.W. Elam, et al., "Growth of ZnO/Al$_2$O$_3$ Alloy Films Using Atmoic Layer Deposition Techniques", American Chemical Society, 2002, pp. 1-9.

J.W. Elam, et al., "Properties of ZnO/Al$_2$O$_3$ Alloy Films Grown Using Atmoic Layer Deposition Techniques", Journal of the Electrochemical Society, 150 (6) pp. G339-G347 (2003).

S.M. George, et al., "Surface Chemistry for Atomic Layer Growth", J. Phys. Chem. 1996, vol. 100, No. 31, pp. 13121-13131.

J.W. Klaus, et al., "Atomic Layer Deposition of SiO$_2$ Using Catalyzed and Uncatalyzed Self-Limiting Surface Reactions". Surface Review and Letters, vol. 6, Nos. 3 & 4 (1999) pp. 435-448.

J.W. Klaus, et al., "Growth of SiO$_2$ at Room Temperature with th Use of Catalyzed Sequential Half-Reactions", Science, vol. 278, Dec. 12, 1997. pp. 1934-1936.www.sciencemag.org.

O. Sneh, et al. "Novel Thin Films Deposition Method For Re-Entry Coverage and Materials Properties Tailoring". International MEMS Workshop, Singapore; Session IV-A (MEMS Education and Material) pp. 1-10.

\* cited by examiner

MOEMS

MOEMS

US 7,426,067 B1

ATOMIC LAYER DEPOSITION ON MICRO-MECHANICAL DEVICES

RELATED APPLICATIONS

The present application is a continuation-in-part of and claims priority to and fully incorporates herein U.S. Provisional Patent Application Ser. No. 60/341,486, entitled "ATOMIC LAYER DEPOSITION ON MICRO-MECHANICAL DEVICES", by Bright et al., filed on Dec. 17, 2001; and the present application is a continuation-in-part of and claims priority to and fully incorporates herein U.S. Provisional Patent Application Ser. No. 60/385,225, entitled "ATOMIC LAYER DEPOSITION ON MICRO-MECHANICAL DEVICES", by Bright et al., filed on May 31, 2002.

STATEMENT OF GOVERNMENT RIGHTS

The present invention was made with United States government support under Grant Number F49620-99-1-0081 awarded by the Air Force Office Of Scientific Research, Grant Number F33615-98-C-5429 awarded by the Air Force Research Laboratory, and Grant Number DGE-9870665 awarded by the National Science Foundation. The government has certain rights in the invention.

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the text and data as described below and in the drawings hereto: Copyright © 2001, University of Colorado Technology Transfer Office, All Rights Reserved.

BACKGROUND OF THE INVENTION

1. Field of the Invention

The invention relates generally to micro-mechanical devices. More particularly, the invention relates to depositing a layer of material on a micro-mechanical device by using atomic layer deposition.

2. Background Information

MicroElectroMechanical Systems (MEMS) are miniature devices that combine micro-electronics with micro-mechanics. The MEMS, which typically have a size ranging from less than a millimeter (m, one thousandth of a meter) to more than about a micrometer (μm, one millionth of a meter), may be used individually or as systems to perform a variety of functions. Many commercially important applications of MEMS have already been established in the areas of telecommunications (e.g., microscopic optical switches such as those available from Lucent Technologies), display technology (e.g., digital mirrors such as the Digital Mirror Device available from Texas Instruments), automotive technology (e.g., micro-accelerometers for airbags such as the ADXL microaccelerometer from Analog Devices), as well as other applications as diverse as, but not limited to, computer memory, drug delivery, and ink jet printing. The number of commercially important applications of MEMS is expected to grow significantly in the foreseeable future.

FIG. 1 shows an exemplary MEMS 100 having a polysilicon cantilever beam 120 that is fixedly attached at an anchor 130 to a polysilicon contact plate that is in turn fixedly attached to a silicon substrate 110. Without limitation, the cantilever 120 may have a length of about 100 micrometers and a width of about 60 micrometers. Also attached to the silicon substrate 110 is a polysilicon contact plate 140 proximate to an end of the cantilever 120. The MEMS 100 may exist substantially in two electromechanical states. As shown, a first state involves a separation distance between the end of the cantilever 120 and the polysilicon contact plate 140. A second state involves sufficient mechanical and electrical contact and coupling between the end of the cantilever 120 and the plate 140. A signal or stimulus may be provided to the MEMS 100 to cause the MEMS 100 to change between the two states.

Two significant problems facing MEMS are frictional wear and stiction. Frictional wear is a common mode of failure and degraded performance for many MEMS. MEMS are often fabricated of silicon by using techniques similar to those used to manufacture integrated circuits. Silicon may wear significantly during operation of the MEMS device. For example, the end of the cantilever 120 may wear against the plate 140. Gears and other engaging MEMS components may experience this problem to an even greater extent.

Stiction is another problem facing MEMS. Stiction is the unintended distortion of adjacent parts as a result of forces such as electrostatic charge build up, surface tension due to a release rinse liquid, or attraction between surface adsorbed water molecules. For example, charge may build up at the end of the cantilever 120 causing the cantilever 120 to unintentionally bend into connection with the contact 140.

One approach to remedy these problems involves coating a MEMS with a self assembled monolayer, as described in the paper, "Self-Assembled Monolayers As Anti-Stiction Coatings For MEMS: Characteristics And Recent Developments", by Roya Maboudian, Robert Ashurst, and Carlo Carraro and published in Sensors and Actuators (82): 219-223, 2000. FIG. 2 shows a MEMS beam portion 220 coated by a self-assembled monolayer 200 of octadecyltrichlorosilane, $(CH_3)(CH_2)_{17}SiCl_3$ 210. This self-assembled monolayer approach has a number of limitations. One limitation is that the coatings are organic and have a very limited range of properties. The organic coatings do not work well for several surfaces commonly used in MEMS. Another limitation is that the coatings are limited to a single monolayer, and as such do not provide sufficient electrical insulation, or sufficient protection against frictional wear.

Another approach is to use chemical vapor deposition (CVD) to coat a MEMS. An application of a CVD to a microengine was described in the article entitled, "Effect of W coating on micro engine performance," by authors S. S. Mani et al., reported in the IEEE 38th Annual International Reliability Physics Symposium, in San Jose, Calif., 2000, pages 146-151. However, CVD has several significant limitations that render it generally unsuitable for MEMS. One limitation is that the high deposition temperatures for CVD are often not suitable for MEMS. For example, the temperature for tungsten deposition by CVD is generally not less than about 450° C., and may be even higher (e.g., 650° C.). Differences in coefficients of thermal expansion between the deposition layer and underlying materials, over the large temperature range between deposition temperature and ambient, may create significant material stresses between the deposition layer and underlying materials. Another limitation is that the deposited layers do not have uniform thickness. In particular, CVD primarily deposits on line-of-sight surfaces, which means that bottom surfaces and small void regions receive less, or almost no coating.

Accordingly, prior art methods for depositing layers on MEMS have a number of significant limitations and improved systems and methods for depositing layers on MEMS are needed.

BRIEF DESCRIPTION OF THE SEVERAL VIEWS OF THE DRAWINGS

The novel features that are characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings:

DETAILED DESCRIPTION OF THE INVENTION

Figure 1:
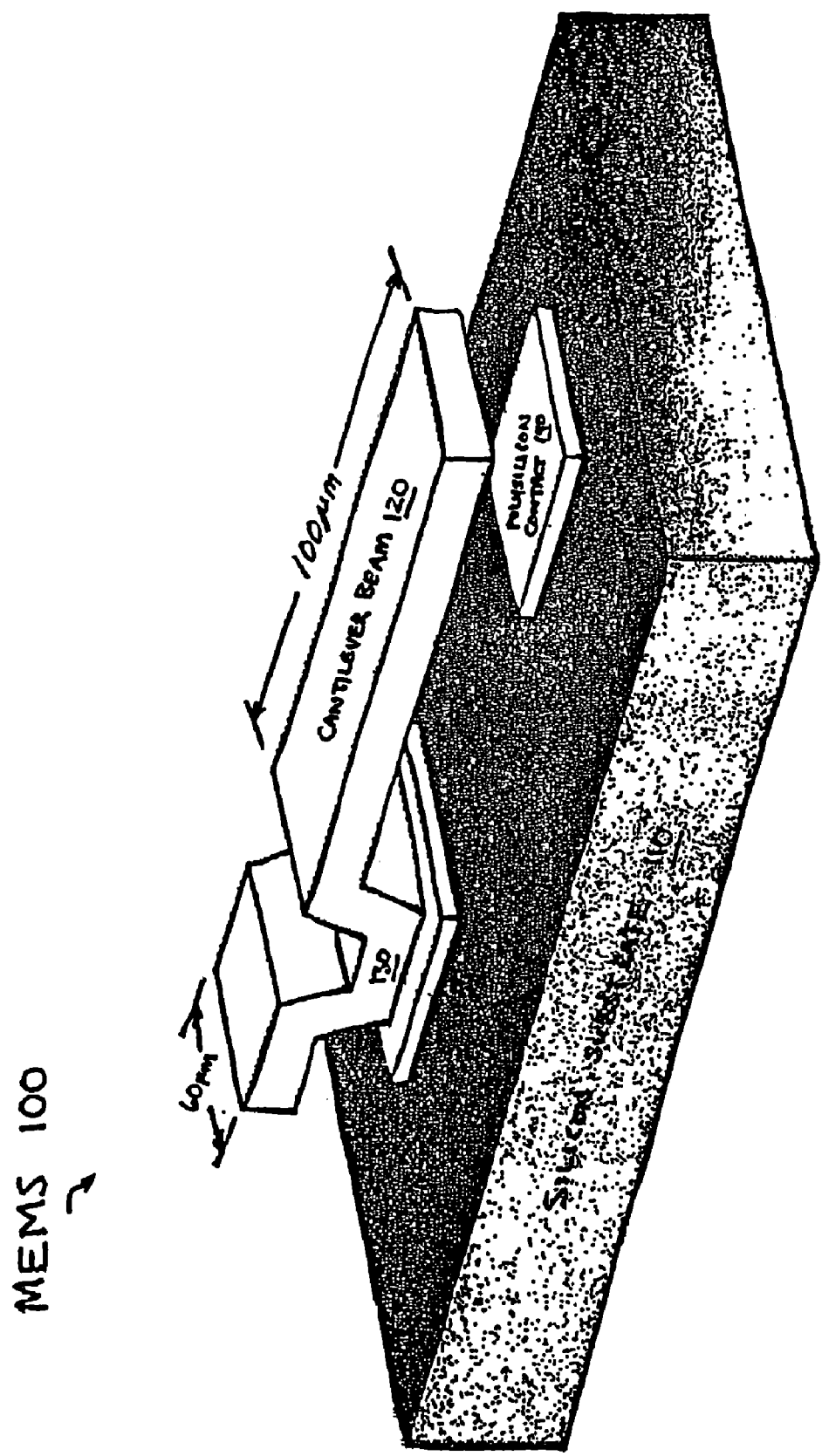
FIG. 1 shows an exemplary MicroElectroMechanical System (MEMS).
Figure 2:
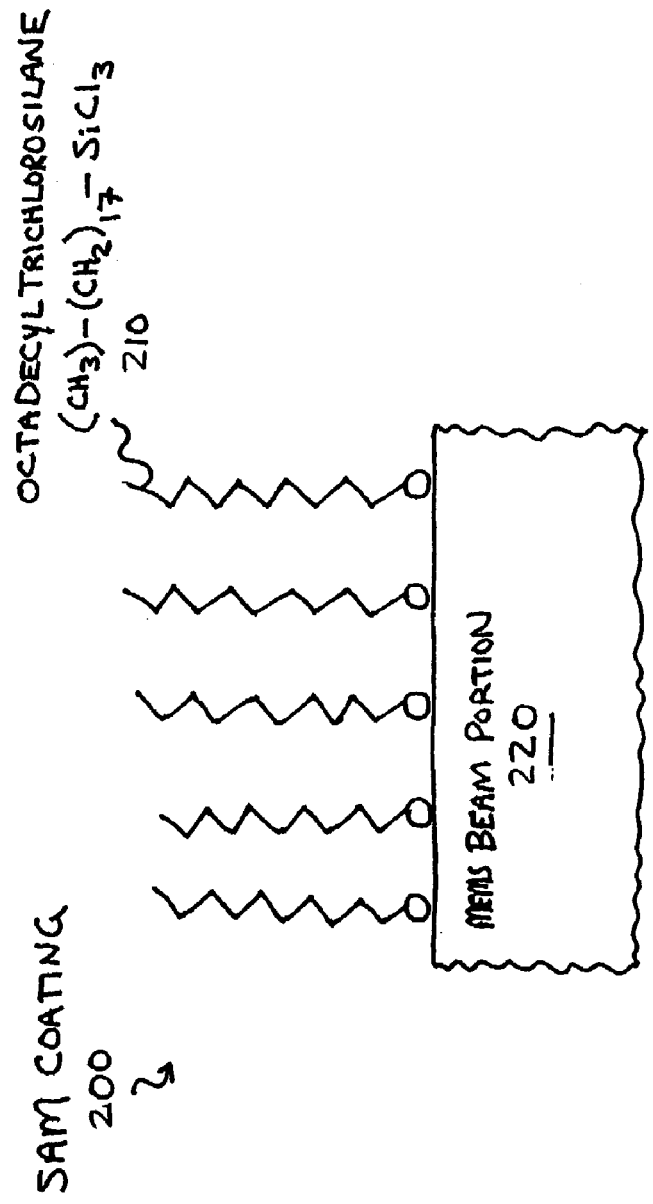
FIG. 2 shows a portion of a MEMS coated by a self-assembled monolayer.

An embodiment of the invention relates to a method for depositing a layer on a released micro-mechanical device by using atomic layer deposition. The deposition process may include performing a cycle of two self-limiting reactions including reactively attaching a first reactant to an outer surface of the device by adding the first reactant to a chamber containing the device, purging excess first reactant from the chamber by adding an inert gas to the chamber at an inlet to purge the excess first reactant via an outlet, and reactively attaching a second reactant to the reactively attached first reactant by adding the second reactant to the chamber. Another embodiment of the invention relates to a micro-mechanical device, such as a MEMS, that contains a layer deposited by ALD. The ALD layer may be deposited on a released MEMS device. Alternatively, the layer may be deposited within a MEMS fabrication process (e.g., a surface micromachining process, a MUMPs (Multi-User MEMS Process) process, a SUMMiT (Sandia Ultra Planar Multi-level MEMS Technology) process, etc.). The device may contain a laminate that has a plurality of alternating layers of different materials. The device containing the ALD layer may be incorporated into a system, such as a micro-electronic device, a display, a projector, a television, a fiber optic router, or an automobile. Still another embodiment of the invention relates to a method for using a micro-mechanical device containing a layer deposited by ALD. As one example, the method may include moving a reflective surface of a micro-mechanical device that contains one or more layers deposited by atomic layer deposition to reflect an incident electromagnetic radiation.

In the following description, for the purpose of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

I. MICRO-MECHANICAL DEVICES AND MEMS

As used herein, the term "micro-mechanical device" will be used broadly to refer to a mechanical device having dimensions smaller than about one millimeter and having a mechanical component to perform a mechanical function such as motion. The mechanical component may include a micro-machined component, a high aspect ratio component (a ratio of a height of a mechanical structure of a device perpendicular to a plane of a substrate to a width of a minimum feature of the device), an attachment to a support (e.g., an anchor to fixedly attach the device to a silicon substrate), a housing to define a void (e.g., cavities, crevices, etc.), a moveable component such as a beam to bend, a resonance plate to vibrate, a hinge to swingably attach a component, a membrane to deflect, a gear to rotate, a switch to open and close, a support component to support the void or the moveable component (e.g., reinforcing ribs to support a resonant plate), micro-fluidic elements to handle small (e.g., picoliter) volumes of fluid (e.g., valves, nozzles, ink-jet printheads, channels, and chambers), and others that are desired for the particular implementation. The mechanical function of movement may be used for conventional means such as to perform work, to cause a force, to induce strain, to contact two components, to move fluids, and to perform other means.

The device may have a transducer to convert one form of energy into another form of energy. For example, the device may have a piezoelectric component to convert a mechanical strain into electrical voltage. The device may also have an actuator to receive a signal, such as from an electrical system and in response create a force to manipulate itself, another mechanical component, or the surroundings. For example, the actuator may move, reposition, regulate, pump, filter, or perform other desired operations.

Figure 3:
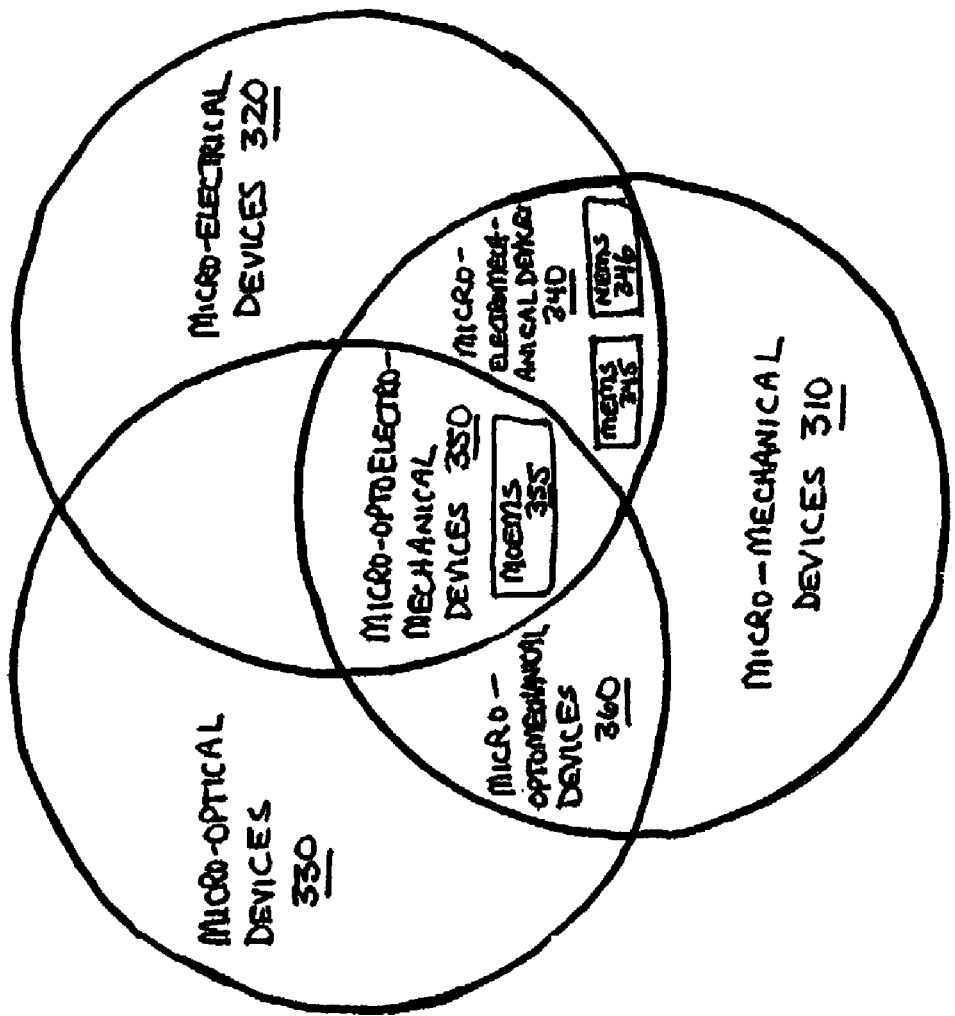
FIG. 3 shows relationships between micro-mechanical devices, micro-electrical devices, and micro-optical devices, according to one embodiment.

FIG. 3 shows relationships between micro-mechanical devices 310, micro-electrical devices 320, and micro-optical devices 330. In particular, the set of micro-mechanical devices 310 includes some micro-electromechanical devices 340 that are also micro-electrical devices 320, some micro-optomechanical devices 360 that are also micro-optical devices 330, and some micro-optoelectromechanical devices 350 that are also both micro-optical devices 330 and micro-electrical devices 320.

The micro-electromechanical devices 340 may perform electrical functions (e.g., generation of current or voltage) in addition to mechanical functions. The micro-electromechanical device will typically include a connection to an electrical system to receive electrical signals from the electrical system and respond accordingly and to provide electrical signals to the electrical system. The electrical system may also comprise a processor to process instructions, a memory to store instructions in machine readable format, and instructions to be executed by the processor to interact with the micro-electromechanical device. The micro-electromechanical device may comprise a transducer to convert a form of mechanical energy into a form of electrical energy. For example, the micro-electromechanical devices 340 may comprise a piezoelectric device to convert pressure or strain into voltage.

The micro-electromechanical devices 340 may comprise a MicroElectroMechanical System (MEMS) 345. The terms "MicroElectroMechanical System" "MEMS" and related terms will be used to refer broadly to a highly miniaturized device having a size greater than about a micrometer and smaller than about a millimeter and having both mechanical components to perform mechanical functions and electrical components to perform electrical functions. MEMS have been around for many years. MEMS are also described extensively in the public literature. Further background information on MEMS, as well as a number of exemplary MEMS, is available in "The MEMS Handbook" by Mohamed Gad-el-Hak, available from the University of Notre Dame, published on Sep. 27, 2001, containing pages 1-1368, assigned ISBN/ISSN:0849300770. The MEMS Handbook is hereby incorporated by reference in entirety.

Figure 4:
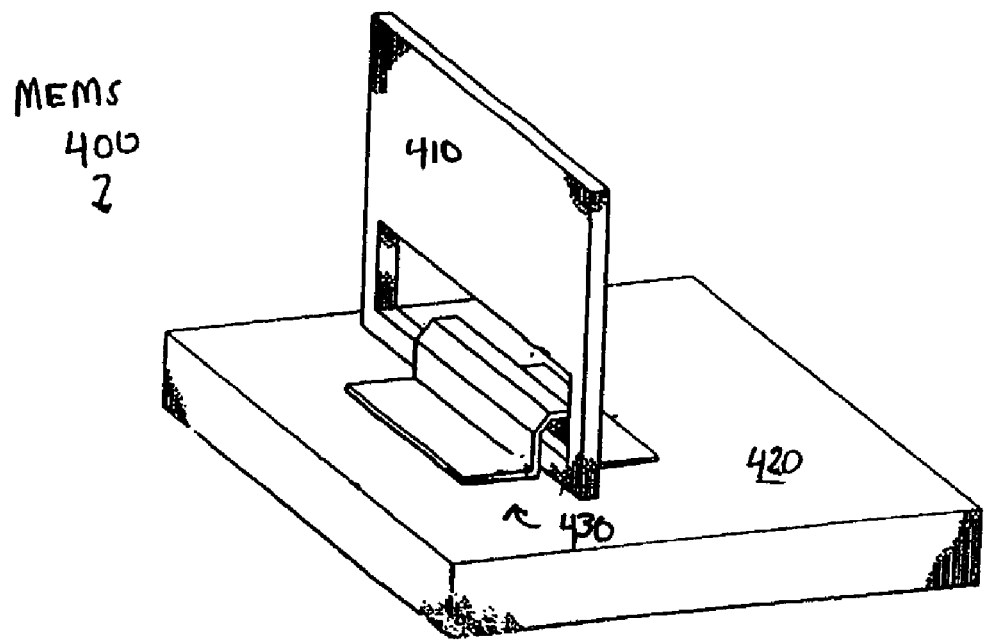
FIG. 4 shows a first exemplary micro-mechanical device, according to one embodiment.
Figure 5:
FIG. 5 shows a second exemplary micro-mechanical device, according to one embodiment.

A variety of MEMS are contemplated to be useful in combination with the present invention. FIG. 4 shows a first example of a MEMS 400 having a moveable plate 410 attached to a substrate 420 by a hinge 430 that may benefit from a layer deposited thereon by a system and method of the present invention. FIG. 5 shows a second example of a MEMS 500 attached to a substrate and comprising a bearing 510, a moveable gear 520, and a motor 530 that may benefit from a layer deposited thereon by a system and method of the present invention. As a first example, both of the MEMS 400 and 500 have moving parts, namely a hinge 430 and a gear 520 that may have reduced wear and increased life as a result of a coating of a sufficiently hard material by a system and method of the present invention. As a second example, both of the MEMS 400 and 500 may have improper alignment or assembly that introduce mechanical play or unintended movement due to looseness, which may be reduced by a applying a properly sized play-reducing coating by a system and method of the present invention. For example, the gear 520 may have a diameter of about 25 microns and a play in the pin-joint of about 1-2 microns, this MEMS may be improved by depositing a layer on the MEMS 500 until the play has been reduced to below 1 micron. Other improvements achievable by the system and method of the present will be discussed in greater detail. Advantageously, such improvements may enhance the performance, life, and value of the MEMS devices 400 and 500, as well as other MEMS.

The micro-electromechanical devices 340 may also comprise a NanoElectroMechanical System (NEMS) 346. The NEMS 346 may have dimensions smaller than a micrometer, which is conventionally regarded to be the lower range of MEMS.

The micro-optoelectromechanical devices 350 may perform both optical and electrical functions in addition to mechanical functions. The devices 350 may be coupled or connected with an electrical system. The optical functions may include but are not limited to absorption, emission, or re-direction of electromagnetic radiation. The device 350 may comprise optomechanical components such as planar waveguides, microstrip radiation detectors, microgap radiation detectors, mirrors, optoelectronic transmitters, optoelectronic receivers, and others.

Figure 6:
FIG. 6 shows a third exemplary micro-mechanical device, according to one embodiment.
Figure 6:
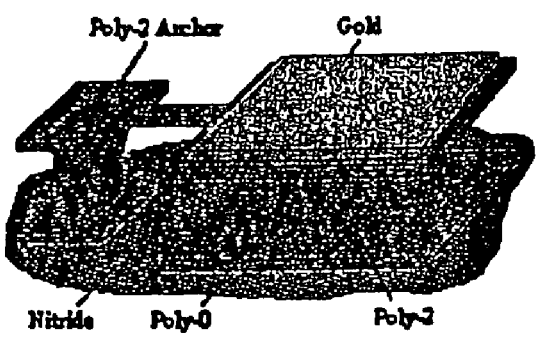
Figure 7:
FIG. 7 shows a fourth exemplary micro-mechanical device, according to one embodiment.
Figure 7:
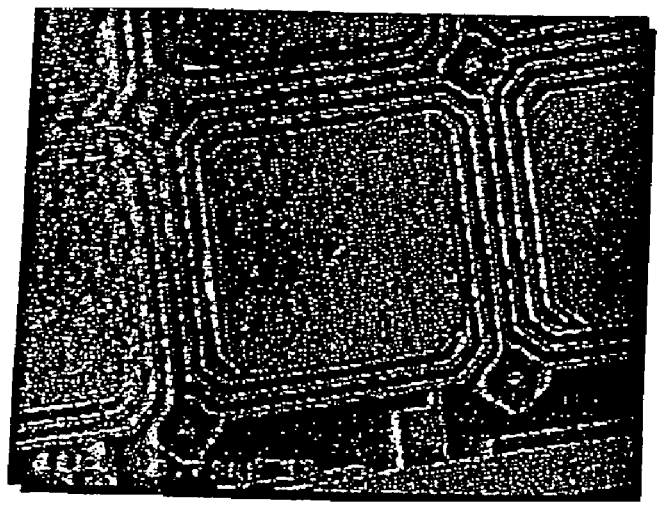

The micro-optoelectromechanical device 350 may comprise a micro-optoelectromechanical system (MOEMS) 355. A variety of MOEMS are contemplated to be useful in combination with the present invention. FIGS. 6 and 7 show exemplary MOEMS that each have electrostatic actuators to induce mechanical movement to achieve optical functions such as reflection of incident electromagnetic radiation.

Although not shown, it should be understood that the micro-mechanical devices 310 may also comprise other devices such as magnetic devices, chemical devices (e.g., chemical sensors to sense chemical potential, ion concentration, etc.), microfluidic devices, biological devices (e.g., genetic diagnosis), and others.

II. DEPOSITING LAYERS ON MICRO-MECHANICAL DEVICES WITH ATOMIC LAYER DEPOSITION (ALD)

Figure 8:
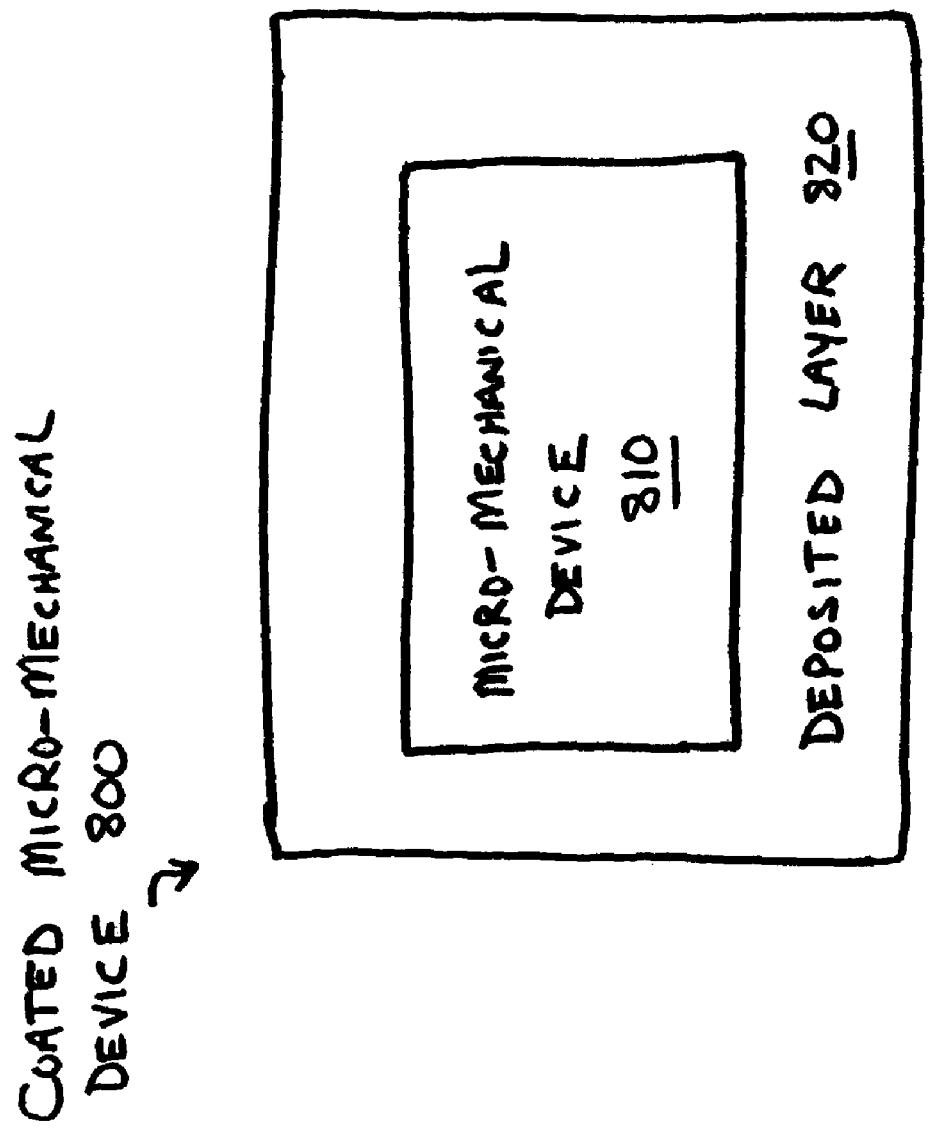
FIG. 8 shows a micro-mechanical device having a layer deposited thereon by a method of one embodiment.

FIG. 8 shows a micro-mechanical device 810, which in one embodiment comprises a MEMS, having a layer 820 deposited thereon by a method of the present invention. Many different embodiments of the layer 820 are contemplated. In general, the layer comprises at least one layer of monolayer thickness that is created by depositing and reactively bonding a reactant to an exposed surface of the device 810. The reactive bonding may comprise chemisorption of a gaseous reactant species. The depositing and reactively bonding may be a substantially self-limiting process based on stoichiometric monolayer coverage of the surface compared with chemical vapor deposition and sputtering which are not self-limited by monolayer coverage. The single layer may be applied to all accessible portions of the device 810 such as voids, cavities, and pores that are accessible via an opening to a source of the reactant (e.g., a reaction chamber). The single layer may be substantially conformal to a shape of the accessible portions (i.e., may closely follow the topography of the underlying surface) and may be substantially uniform in thickness, in contrast to a coating applied by sputtering, CVD, or the like. The layer 820 may also comprise additional layers similarly deposited so as to form a strata or laminate comprising a plurality of so deposited layers. As desired, each of the additional layers may be of the same material as the first or a different material.

According to one embodiment, the layer 820 is deposited by atomic layer deposition (ALD) or an ALD-related technique. ALD is a deposition or coating process to deposit conformal layers or films on surfaces by reactively attaching (e.g., chemisorbing) typically gas phase reactant molecules as substantially a monolayer onto a solid surface. ALD may be self-limiting in that deposition essentially stops automatically after substantially a stoichiometric amount of the reactant has chemisorbed to the surface. This may allow near Angstrom-level thickness control. The deposition may be conformal to complex three-dimensional geometries including pores, deep and narrow trenches, porous structures, powders, and out-of-sight regions that would be difficult to reach by sputtering but which are accessible to gaseous reactant. Additional layers may be deposited one layer at a time. ALD may rely on a binary sequence of self-limiting chemical reactions between gas-phase reactant molecules and a solid surface. Byproducts generated by the chemical exchange are typically gases that can be easily removed and which do not typically dirty the reactor.

ALD is described extensively in the public literature. Further background information on one embodiment of ALD is described in U.S. Pat. No. 6,287,965 B1, entitled "Method For Forming Metal Layer Using Atomic Layer Deposition And Semiconductor Device Having The Metal Layer As Barrier Metal Layer Or Upper Or Lower Electrode Of Capacitor", issued Sep. 11, 2001 to Kang et al. U.S. Pat. No. 6,287,965 B1 is hereby incorporated by reference in its entirety. Further background information on another embodiment of ALD is described in U.S. Pat. No. 6,270,572 B1, entitled "Method For Manufacturing Thin Film Using Atomic Layer Deposition" issued Aug. 7, 2001 to Kim et al. U.S. Pat. No. 6,270,572 B1 is hereby incorporated by reference in its entirety. Further background information on ALD is available in the "Handbook Of Thin Film Materials", a five volume set published on Oct. 15, 2001, assigned ISBN:0125129084, and available from Academic Press of San Diego, Calif. Chapter 2 of Volume 1 entitled "Atomic Layer Deposition", by Mikko Ritala and Markku Leskela, describes one embodiment of ALD and is hereby incorporated by reference in entirety.

To put the importance of the deposited layer on the device into context, and to help the reader in understanding the significance of the developments of the present inventors, it is helpful to recite some of the events that led to today's state of the art. MEMS devices have existed in the arts for many years. An early micro-actuator MEMS device was described in the article entitled, "The Resonant Gate Transistor," by authors H. C. Nathanson, W. E. Newell, R. A. Wickstrom and J. R. Davis Jr., published in the journal IEEE Transactions on Electron Devices, volume ED-14, pages 117-133, and published in the year 1967. Since that time numerous MEMS abound in the general and patent literatures. As such, the field of MEMS is an old and crowded art. The same is true of ALD. An exemplary ALD is described in the article entitled, "Atomic Layer Epitaxy", by T. Suntola, published in the journal Thin Solid Films, 216:84, published in the year 1992.

Yet, until the developments of the inventors those skilled in the art have not recognized the advantages of using ALD on MEMS. This lack of any prior use of ALD on MEMS is highly significant, given the numerous advantages disclosed herein. This may be due, at least in part, to the fact that MEMS and ALD constitute different technological fields and non-analogous arts. Traditionally, MEMS have been the realm of those skilled in the mechanical arts, whereas ALD has been the realm of those skilled in the chemistry arts. A practitioner having ordinary skill in the MEMS art is presumed to know the prior art in this art, and perhaps clearly allied lines of endeavor, but is not expected to be aware of, or to be bound by, teachings in a non-analogous art, such as ALD, which has different elements and purposes.

Significantly, the present inventors have found that depositing layers on micro-mechanical devices (e.g., MEMS) with ALD affords unexpected, superior, disproportionate, and surprising results that are vastly superior to those achieved by prior art approaches, such as CVD and SAMs. There is a large amount of synergism in the combination of ALD and MEMS. As such, the micro-mechanical device 810 is not merely a substrate for the deposited layer 820, and in many of the embodiments disclosed herein, the ALD layer is integral to the functioning of the device.

The ALD layer has a number of characteristics that make it particularly well suited for application to the micro-mechanical device. One characteristic is an ability to deposit very thin nanoscale layers. The layers may have a thickness on the order of an Angstrom, or several, which may be useful in cases where a thick layer would impede device operation. Another advantageous characteristic is that the self-limiting nature of ALD allows extremely precise control of deposition thickness. Because ALD is based on self-limiting reactions, which is not the case for CVD, each cycle deposits approximately a monolayer, with a thickness on the order of an Angstrom. The layers may be built up monolayer-by-monolayer and the resulting ALD layers are flat, uniform in thickness, and pinhole free. The nanoscale thickness and good deposition thickness control is well suited for the minute dimensions used in MEMS.

Yet another advantageous characteristic of ALD that makes it well suited for MEMS is that ALD may allow very conformal coatings on even complex exposed three-dimensional surfaces. This may allow coating micro-devices having gaps, cavities, pores, porous regions, trenches, out-of-sight surfaces, and high aspect ratio structures provided that a reactant gaseous species has access to the surface (i.e., is not entirely blocked). The highly conformal layers afforded by ALD are well suited for the often complex three-dimensional structures in MEMS, including out-of-sight surfaces, which would not be coated by CVD or PVD, and which if not coated would significantly alter or impede the mechanical operation of the device. In contrast, CVD predominantly deposits on line-of-sight surfaces and the resulting non-conformal layers may mechanically stress and deform the device, impeding proper device operation. Because ALD deposits substantially conformal layers having uniform thickness on both line-of-sight and out-of-site surfaces the mechanical stresses due to different materials tend to negate and corresponding device deformations are reduced. The ability to both create highly conformal, regular coatings of customizable thickness including very thin films makes ALD very well suited as a coating method for micro-devices which often have complex geometries with moving components with tight tolerances.

Still another advantageous characteristic of ALD is reduced deposition temperatures compared to CVD. The high temperatures expected for CVD may cause thermal stresses that damage the devices and may damage sense and control electronics and other thermally sensitive materials of the devices. Because the deposition temperature of ALD is typically lower than that expected for CVD, there is reduced thermal stress, for example due to different coefficients of thermal expansion, and reduced damage of thermally sensitive materials. Accordingly, ALD allows deposition at relatively low, non-damaging temperatures, which do not damage the mechanical features of the device. Industrial scale reaction equipment is also already available for ALD. For example, ALD reactors have been used in the semiconductor manufacturing industry to deposit layers on integrated circuits.

Accordingly, the deposition of an ALD layer on a MEMS affords unexpected and vastly superior results, due in part to a synergism between ALD and MEMS, which has heretofore been unrecognized, prior to the developments of the present inventors. The lack of any prior art implementation of ALD on MEMS is even more significant, given the numerous advantages and synergism disclosed herein.

III. METHODS FOR DEPOSITING ON MICRO-MECHANICAL DEVICES WITH ALD

Figure 9:
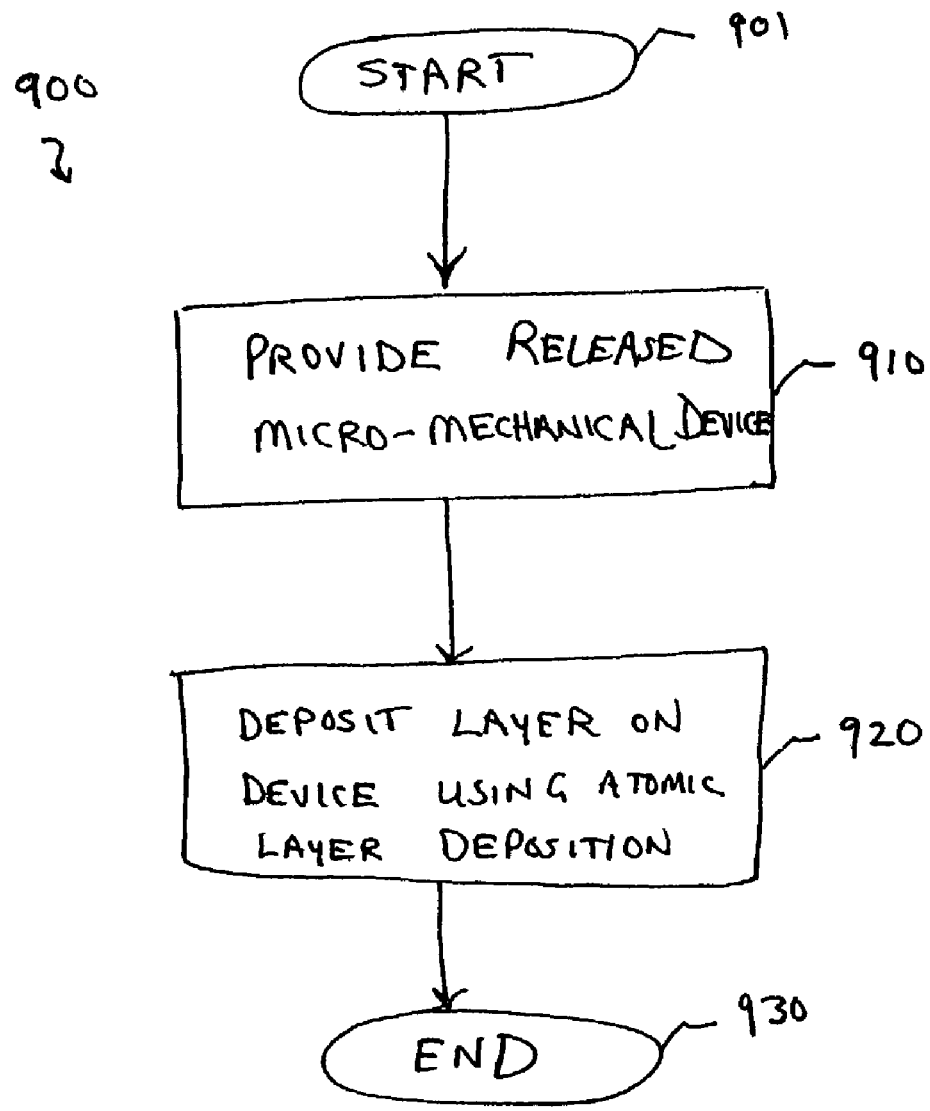
FIG. 9 shows a method for depositing a layer on a micro-mechanical device by atomic layer deposition (ALD), according to one embodiment.

FIG. 9 shows a method 900, according to a first embodiment, for depositing a layer on a micro-mechanical device by ALD. The method commences at block 901, and then proceeds to block 910, where a released micro-mechanical device is provided. The released device may be obtained commercially. Many MEMS are commercially available. As a first example, the OEM Pressure Silicon Die SM5102 is available from Silicon Microstructures, Inc. of Fremont, Calif. to perform piezoresistive pressure sensing based on a mechanical-electrical transducer to change resistive properties under pressure stress that allow measurement of pressure is a first example. As a second example, the ADXL 190 microaccelerometer is available from Analog Devices of Norwood, Mass. and has an electrostatic actuator to deflect when subjected to an input acceleration and produce a signal voltage corresponding to the acceleration is a second example. Other devices are similarly available commercially.

Alternatively, the MEMS may be fabricated by fabricating an un-released micro-mechanical device having a structural layer containing a mechanical component and a sacrificial layer constraining the mechanical component and then performing a release etch to remove a sacrificial layer and release the micro-mechanical device by releasing the mechanical component. This will be discussed in more detail in FIG. 10.

Another option is to fabricate a released micro-mechanical device by bulk micro-machining. For example a three-dimensional micro-structure involving a mechanical component may be fabricated by etching a masked silicon wafer in orientation-dependant etching solutions, by laser ablation, or by other well-known methods.

The method advances from block 910 to block 920 where a layer is deposited on the micro-mechanical device. This may include placing the released micro-mechanical device in a reactor system and performing atomic layer deposition as will be described in greater detail below. The method terminates at block 930.

Figure 10A:
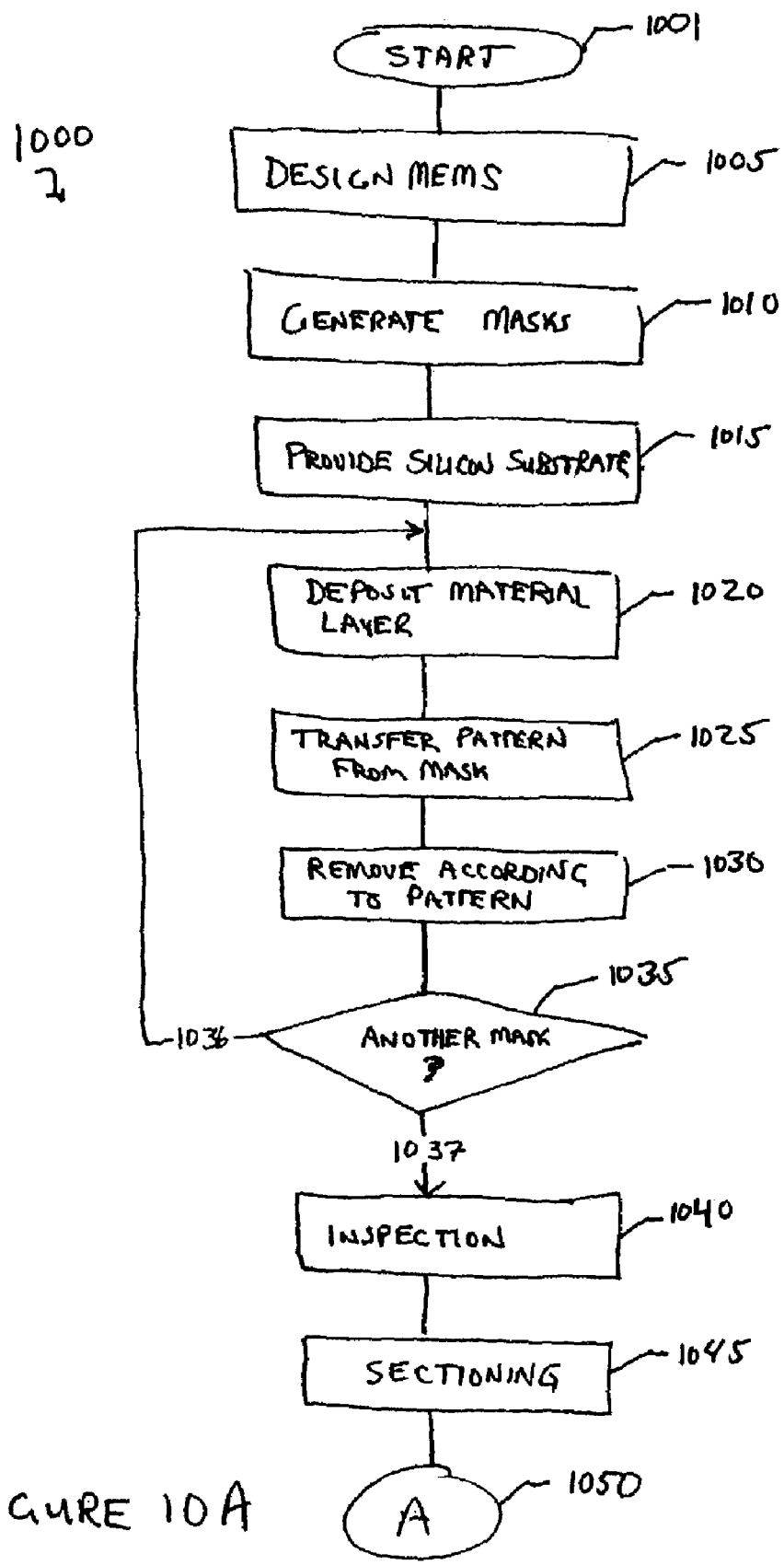
FIGS. 10*a-b* shows a method for forming a released MEMS, depositing a layer on the released MEMS by ALD, and performing other post deposition operations, such as packaging, sealing, and testing, according to one embodiment.
Figure 10B:
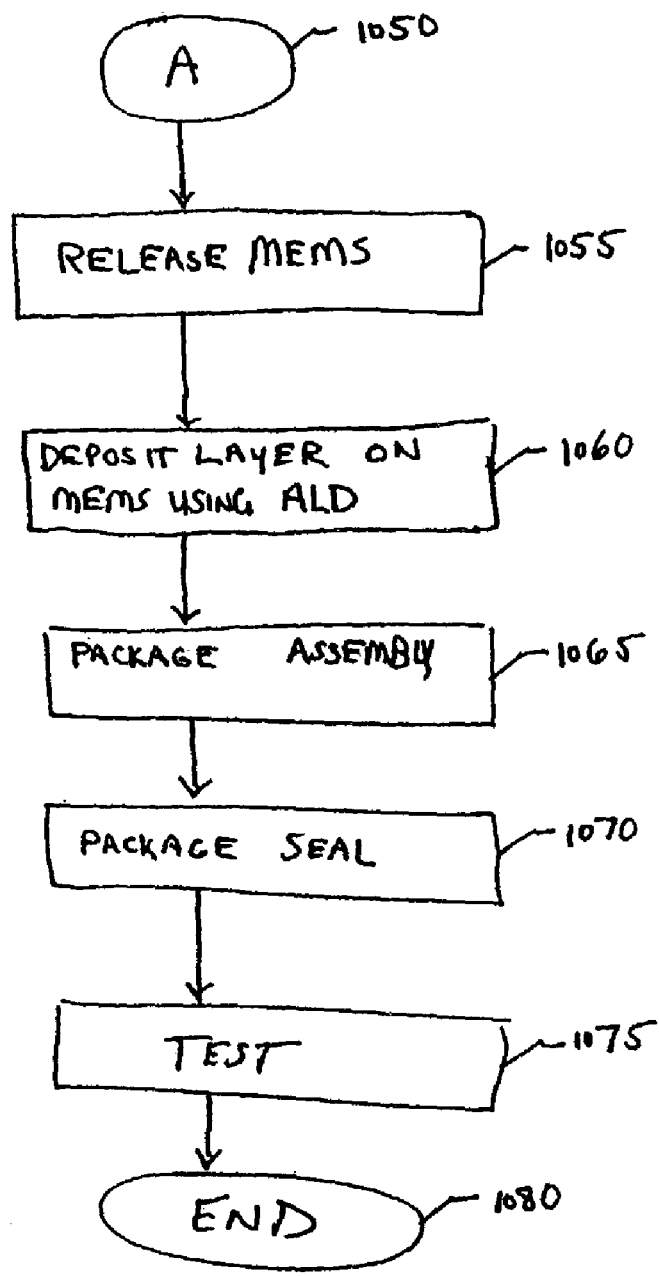

FIGS. 10A-B shows a method 1000 (block 1050 shows the transition between FIG. 10A and FIG. 10B), according to a second embodiment, for depositing a layer on a micro-mechanical device by ALD. In particular, blocks 1001-1055 show providing a released micro-mechanical device, according to one embodiment. These blocks are well-known to a person having an ordinary level of skill in the art and the benefit of the present disclosure and so will not be discussed in detail. Other embodiments for providing a released micro-mechanical device are contemplated including those incorporating micro-fabrication processing, conventional integrated circuit (IC) processing (e.g., CMOS, Bipolar, or BICMOS processes), micro-machining processing that selectively removes portions to create mechanical details and structures, patterning (e.g., lighography), additive processing (e.g., deposition of a material, thin film deposition, sputtering, evaporative plating, spin-on, etc.), subtractive processing (e.g., removal of material, etching, micro-machining, etc.), and other processing.

The method advances from block 1055 to block 1060 where a layer is deposited on the released section using ALD. According to one embodiment, the layer is deposited by using the method shown in FIG. 11.

The method advances from block 1060 to block 1065 where package assembly is performed and then advances to block 1070 where the package is sealed. The layer deposited at block 1060 may provide a sufficiently tight, conformal, and low-permeability layer to prevent chemicals in the environment of use such as water from penetrating the layer to any appreciable extent. Advantageously, this may allow sealing at block 1070 to be performed by using a comparatively inexpensive non-hermetic material (e.g., plastic, epoxy, or molding compounds used for microelectronic packaging) rather than a costly hermetic material like ceramic. This may decrease the cost of manufacture of micro-mechanical devices and increase the range of applications in which their use is cost effective. The method advances from block 1070 to block 1075 where the unit is tested and then terminates at block 1080.

Figure 11:
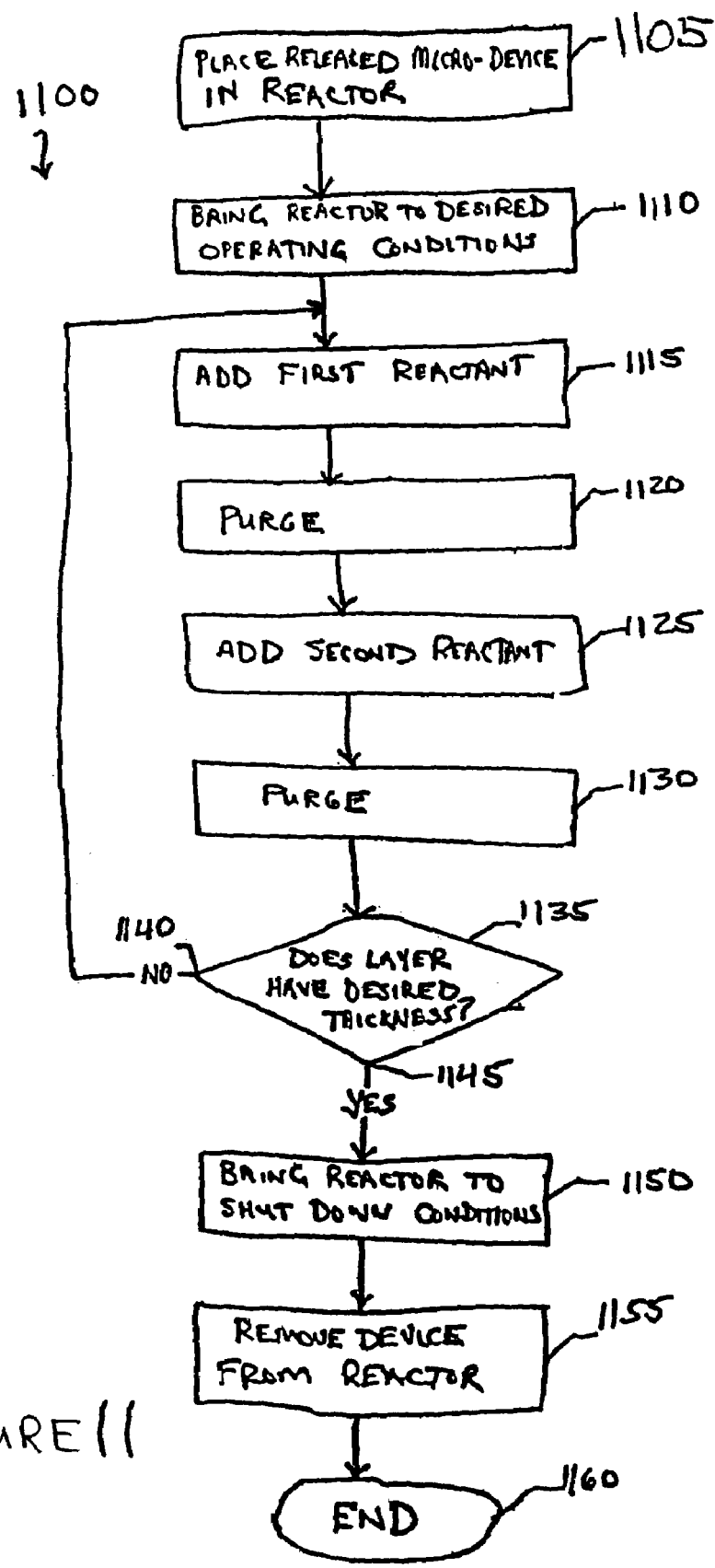
FIG. 11 shows a method for depositing a layer on a released micro-mechanical device by atomic layer deposition, according to one embodiment.

FIG. 11 shows a method 1100, according to one embodiment, for depositing a layer on a micro-mechanical device by ALD. The method 1100 may be used at block 920 of FIG. 9, block 1060 of FIG. 10, or both.

After commencing, the method advances to block 1105 where a released micro-device is placed into a reactor. The method advances from block 1105 to block 1110 where the reactor is brought to a desired, typically predetermined, operating conditions. This may include bringing the reactor to an operating temperature not less than approximately 25° C. (room temperature) to a temperature not greater than approximately 500° C. Depending upon the particular reaction kinetics, at temperatures less than 25° C., the kinetics of reaction may be undesirably slow and at temperatures greater than 500° C. materials and devices may be thermally damaged. In general, higher temperatures provide faster kinetics but increased risk of thermal damage to materials. The favored temperature in some implementations is not less than 50° C., to ensure a sufficiently fast reaction, and not greater than 200° C., to avoid damaging thermally sensitive materials (e.g., the device itself or a thermally sensitive package where the device is employed). If the materials are more thermally sensitive, or if the micro-mechanical device has structures that may be thermally damaged (for example due to differences in coefficient of thermal expansion when the device is cooled from deposition temperature to ambient temperature), a relatively lower temperature may be desired. For example, a temperature not greater than approximately 50° C. or not greater than approximately 100° C. may be desired. If the materials and the structures are more thermally stable, a temperature in the range of approximately 100° C. to 200° C. may be desired. Temperatures that provide sufficient kinetics for a particular ALD reaction and that avoid damaging devices may be determined without undue experimentation by those skilled in the arts having the benefit of the present disclosure.

This may include bringing the reactor to an operating pressure below atmospheric pressure to remove impurities that may potentially compete for adsorption sites on the surface of the device and to maintain a laminar rather than turbulent flow in the reactor which promotes rapid purging. This may include establishing vacuum via a vacuum means (e.g., vacuum pump, water jet, etc.) less than about 50 Torr (1 atmosphere is equivalent to 760 Torr) or preferably less than about 1 Torr. Those having an ordinary level of skill in the art will appreciate that this is not a high level of vacuum and is easily established using conventional equipment and methods. Alternatively, the reactor may be operated at atmospheric pressure or above atmospheric pressure.

The method advances from block 1110 to block 1115 where a first reactant is added to the reactor. This may include using a carrier gas to transfer the first reactant from a source of the first reactant to the reactor. For example, this may include establishing a partial pressure or saturation pressure of the first reactant in a flow of carrier gas by contacting the carrier gas and the first reactant. Carrier gas may be bubbled through a source of liquid first reactant to establish at least a partial concentration of the first reactant in the carrier gas and then the carrier gas may be provided though an inlet to the reactor. The carrier gas may include an inert gas that does not compete appreciably with the first reactant for adsorption sites on an exposed surface of the device. For example, the carrier gas may include Nitrogen ($N_2$), a noble gas (Argon, Helium, Neon, etc.) or another carrier gas that is desired for the particular implementation.

The first reactant may be added to the reactor in sufficient quantity and for a sufficient period of time to create a stoichiometric monolayer of first reactant chemisorbed on the exposed surface of the device. For many reactants the chemisorption kinetics proceed sufficiently rapidly such that a quick pulse of the reactant in carrier gas is sufficient to provide adequate coverage. For example, the pulse may last less than several seconds or preferably less than a second, such as about 0.1 seconds. The quantity may include at least an amount greater than the stoichiometric amount needed to cover a monolayer of the surface. For example, about ten times as much reactant as needed for monolayer reactive attachment to the surface may be used.

The method advances from block 1115 to block 1120 where the reactor is purged using carrier gas to remove excess reactant and reaction products. This may include blocking the addition of the first reactant to the carrier gas, such as by closing a valve, and continuing transfer of carrier gas to the reactor to remove physically adsorbed first reactant, gas-phase first reactant, and any reaction product species that may exist in the reactor. This may be done for a time sufficient to clear the first reactant from the inlet transfer tubing and the reactor. This may last between about 1-10 seconds or preferably less than about 5 seconds.

The method advances from block 1120 to block 1125 where a second reactant is added. The second reactant may be different than the first reactant and may be chemically reactive with an exposed chemical group of the adsorbed first reactant. The addition of the second reactant may be performed similarly to the addition of the first reactant, although this is not required.

The method advances from block 1125 to block 1130 where the reactor is purged. This may be done similarly to the purge at block 1120.

The method advances from block 1130 to determination block 1135 where a determination is made whether the deposited layer has the desired thickness. Different embodiments of this determination are contemplated. According to a first embodiment, this may include making a measurement in situ of a thickness of the deposited layer, a mechanical property associated with the deposited layer, or an electrical property associated with the deposited layer. In one embodiment an operation of a device having the layer deposited thereon may be measured and a determination may be made whether to deposit additional layer thickness based on the measurement. For example, a frequency of a micro-resonator, which may be affected by the thickness of the deposited layer, may be measured to determine whether more layers are desirable to modify the frequency. Advantageously, this may be useful for tuning released MEMS devices to reduce variation between devices. As a second example, the determination may be used to reduce unintended movement due to looseness (e.g., mechanical play) by measuring the degree of play and then determining based upon the measurement whether to deposit an additional layer thickness to tighten the tolerance of the device and reduce the play. According to another embodiment, block 1135 may be accomplished by keeping a count of the number of cycles through blocks 1115 to 1135 and comparing the count to a predetermined count corresponding to a predetermined laminate layer having a thickness that is desired for the particular implementation. This determination may be performed automatically by software or by an operator. If "no" is the determination 1140, the method revisits blocks 1115 through 1130.

If "yes" is the determination 1145, the method advances to block 1150 where the reactor is brought to shut down conditions. Typically the shut down conditions are atmospheric pressure and room temperature. This may include gradually disengaging a heating system and a vacuum system while continuing to provide carrier gas to the reactor to return the reactor, the device, and the layer to the ambient conditions without inducing thermal or pressure stresses that may cause damage.

The method advances from block 1150 to block 1155 where the device may be removed from the reactor. The method terminates at block 1160.

Figure 12:
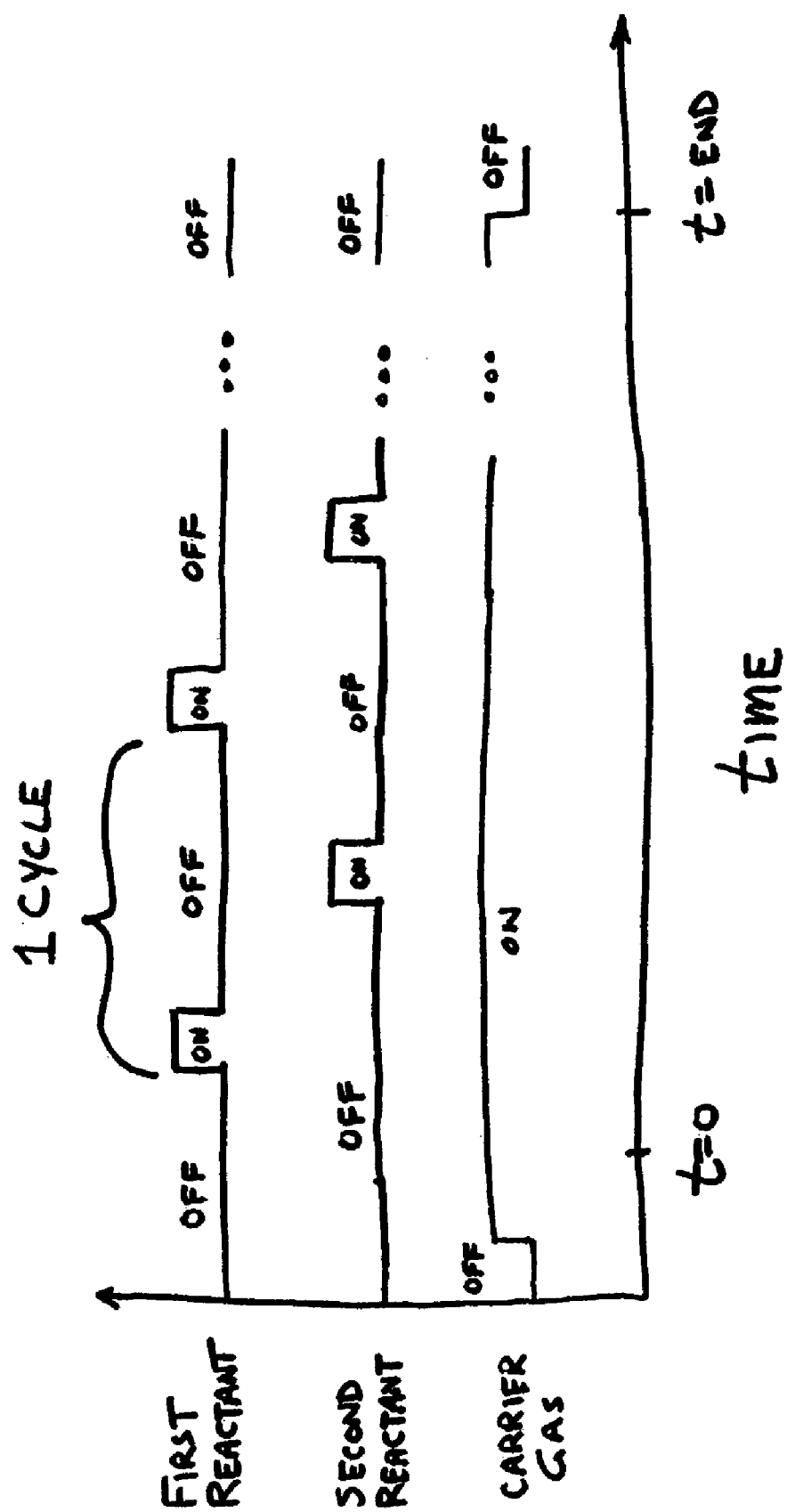
FIG. 12 shows a sequence diagram for ALD, according to one embodiment.

FIG. 12 shows a sequence diagram for depositing a layer by using ALD, according to one embodiment. On the horizontal axis is plotted increasing time from left to right. On the vertical axis is plotted independently added levels of a first reactant, a second reactant, and a carrier gas. Before time zero, flow of the carrier gas, the first reactant, and the second reactant are zero. At time zero the carrier gas is transferred to the reactor to establish desired operating conditions in the reactor. The carrier gas may be heated and a vacuum pulled on the reactor. Some time later, a first reaction cycle may be initiated by adding a pulse of the first reactant to the reactor. This may last about 0.1 seconds. The added first reactant may reactively attach with sites on the exposed surface of the micro-device by establishing a chemical bond with the site and potentially expelling a gaseous product compound. After the pulse, the reactor may be purged with carrier to remove unreacted first reactant and any unattached product compounds. The purge may last about two seconds. After purging a pulse of the second reactant may be added. This may last about 0.1 seconds. The second reactant may react with the attached first reactant to effectively deposit a layer on the surface of the micro-device and may potentially expel a gaseous product compound. After the pulse, the first cycle may be finalized by purging with carrier. The purge may last about two seconds.

Sequences similar to the one described above may be repeated any desired number of times to achieve a layer having a desired thickness. Each cycle may contribute a two-dimensional layer portion having a thickness of about a monolayer of one or both of the reactants, depending on the particular reaction scheme, which for many reactants and schemes is approximately an Angstrom. The thickness of the layer may be built up as a nearly linear function of the number of deposition cycles and may be easily controlled. In this particular example, a layer having a thickness of about 0.2 microns may be created by repeating the cycle between about 1000-3000 times each cycle adding a thickness of about a single Angstrom. After any desired repetition of the described scheme, the reactant additions may be stopped and then the reactor may be shut down.

IV. EXEMPLARY MATERIALS THAT MAY BE DEPOSITED BY ALD

ALD may be used to deposit a wide variety of materials. Exemplary materials that may be deposited by ALD include materials selected from the group consisting of a single element, an oxide of a single element, a composite oxide, a nitride of a single element, and a composite nitride.

The single element may be selected from the group consisting of Mo, Al, Cu, Ti, Ta, Pt, Ru, Rh, Ir, W, and Ag.

The oxide of the single element may be selected from the group consisting of $Al_2O_2$, $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$.

The composite oxide may be selected from the group consisting of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr, Ca)RuO_3$, $In_2O_3$ doped with Sn, $In_2O_3$ doped with Fe, and $In_2O_3$ doped with Zr.

The nitride of a single element may be selected from the group consisting of SiN, NbN, ZrN, TaN, $Ya_3N_5$, AlN, GaN, WN, and BN.

The composite nitride may be selected from the group consisting of WBN, WSiN, TaSiN, AlSiN, AlTiN, an nitride of silicon (e.g., $Si_xN_z$, where x and z are integers), and an oxynitride of silicon (e.g., $Si_xO_yN_z$ where x, y and z are integers).

Other materials are also contemplated including others mentioned in the present disclosure and those listed in Table 1.

TABLE 1

| Materials that may be deposited by ALD | |
|---|---|
| Group II-VI compounds | ZnS, ZnSe, ZnTe, $ZnS_{1-x}Se_x$ CaS, SrS, BaS, $SrS_{1-x}Se_x$ |
| Group II-VI based (TFEL) | CdS, CdTe, MnTe, HgTe, $Hg_{1-x}Cd_xTe$, $Cd_{1-x}Mn_xTe$ |
| thin film electroluminescent phosphors | ZnS:M (M = Mn, Tb, Tm), CaS:M (M = Eu, Ce, Tb, Pb), SrS:M (M = Ce. Cu, Tb, Pb) |
| Group III-V compounds | GaAs, AlAs, AlP, InP, GaP, InAs $Al_xGa_{1-x}As$, $Ga_xIn_{1-x}As$, $Ga_xIn_{1-x}P$ |
| Nitrides | |
| Semiconductors/Dielectric | AlN, GaN, InN, $SiN_x$, $Ta_3N_5$ |
| Metallic | TiN. Ti-Si-N, TaN, NbN, MoN, $W_2N$ |
| Oxides | |
| Dielectric | $Al_2O_3$, $TiO_2$, $ZrO_2$, $HfO_2$, $Ta_2O_5$, $Nb_2O_5$ $Y_2O_3$, MgO, $CeO_2$, $SiO_2$, $La_2O_3$, $SrTiO_3$, $BaTiO_3$, $Bi_xTi_yO_z$ |
| Transparent conductors/ | $In_2O_3$, $In_2O_3$:Sn, $SnO_2$, $SnO_2$:Sb, ZnO, ZnO:Al, ZnO:B |
| Semiconductors | ZnO:Ga, $Ga_2O_3$, $WO_3$, NiO, $Co_3O_4$, $MnO_x$ |
| Ternary oxides | $LaCoO_3$, $LaNiO_3$, $LaMnO_3$ |
| Fluorides | $CaF_2$, $SrF_2$, $ZnF_2$ |
| Elements/metals | Si, Ge, Cu, Mo, Ta, W |
| Others compounds | $La_2S_3$, PbS, $In_2S_3$, $CuGaS_2$, SiC |

Physical properties for many of the materials are available in the CRC Materials Science and Engineering Handbook, Third Edition, edited by J. F. Shackelford and W. Alexander, published 1999, published by CRC Press, assigned ISBN 0-8493-2696-6. This handbook is hereby incorporated by reference in its entirety.

V. EXAMPLES

Having been generally described, the following examples are given as particular embodiments of the invention, to further illustrate some of the properties and demonstrate the practical advantages thereof, and to further allow one skilled in the art to utilize the invention. It is understood that these examples are to be construed as merely illustrative.

Example 1

Depositing a Frictional Wear Reducing Layer on a Micro-Mechanical Device

ALD may be used to deposit materials suitable to reduce frictional wear on micro-mechanical devices. This may be achieved by depositing a layer comprising a material having a hardness, wear-resistance, coefficient of friction, or other material characteristic more favorable than that of at least a portion of the device to protect moving parts from frictional wear and increase the life of the device. For example, the device may comprise a first silicon portion having a hardness of about 10-12 GPa (about 7 on the Mohs hardness scale) to contact a second silicon portion having a similar hardness and the deposited layer may comprise a material sufficiently harder than silicon deposited on the first portion and the second portion. Advantageously, the layer may contact on behalf of the first portion and the second portion and may reduce wear due to the greater hardness. For example, the material deposited may comprise alumina ($Al_2O_3$) having a hardness of about 2500 kg/mm/mm (9 on the Mohs scale), which is greater than that of polysilicon and better able to withstand movement and friction. Alternatively, another material having a hardness greater than about 7 on the Mohs scale may be used, such as a material having a hardness of about 9-10 (e.g., titanium nitride, TiN), a material having a hardness of about 8 (e.g., tantalum nitride, TaN), a hardness of about 9 (silicon carbonate, SiC), or others. Advantageously, the deposition of such a material may reduce operational wear and increase life of the moving parts.

Example 2

Depositing an Electrically Insulating Layer on a Micro-Electromechanical Device

ALD may be used to deposit materials suitable to reduce electrical shorting in micro-electromechanical devices. This may be achieved by depositing a layer that comprises a material or materials that have sufficient electrical properties to prevent electrical shorting between proximate electrical components or between proximate devices. This may be done by depositing a material that is sufficiently dielectric (i.e., provides sufficient electrical insulation) or that has a sufficient electrical resistance to prevent electrical shorting.

Consider a micro-mechanical device that has a first silicon portion to contact a second proximate silicon portion. Silicon has particular electrical properties including a dielectric constant of about 11-12 and an electrical resistance of about 1 Ohm*cm for doped silicon. Such electrical properties may lead to an electrical shorting tendency that may be reduced by depositing between the first silicon portion and the second silicon portion a material having electrical properties that provide reduced electrical shorting tendency. For example, the material may have a lower dielectric constant than silicon, a higher electrical resistance than silicon, or both. Preferably the dielecric constant is less than about 10 and the electrical resistance is greater than about $10^6$ Ohm*cm. For example, a layer of $Al_2O_3$ having a thickness of at least about 0.01 microns may be deposited on the first silicon portion and the second silicon portion to contact on behalf of the portions and to reduce the tendency of electrical shortening. $Al_2O_3$ has particular electrical properties including a dielectric constant of about 7-10 and an electrical resistance of about $10^{15}$ Ohm*cm. It may also be such, depending on the particular micro-mechanical device, that the deposited material does not provide so much electrical insulation as to prevent electrical engagement in an intended electrical state involving electrical engagement between the first portion and the second portion through the insulation.

Example 3

Exemplary Device Having a Wear Reducing and Electrically Insulating Layer

Figure 13:
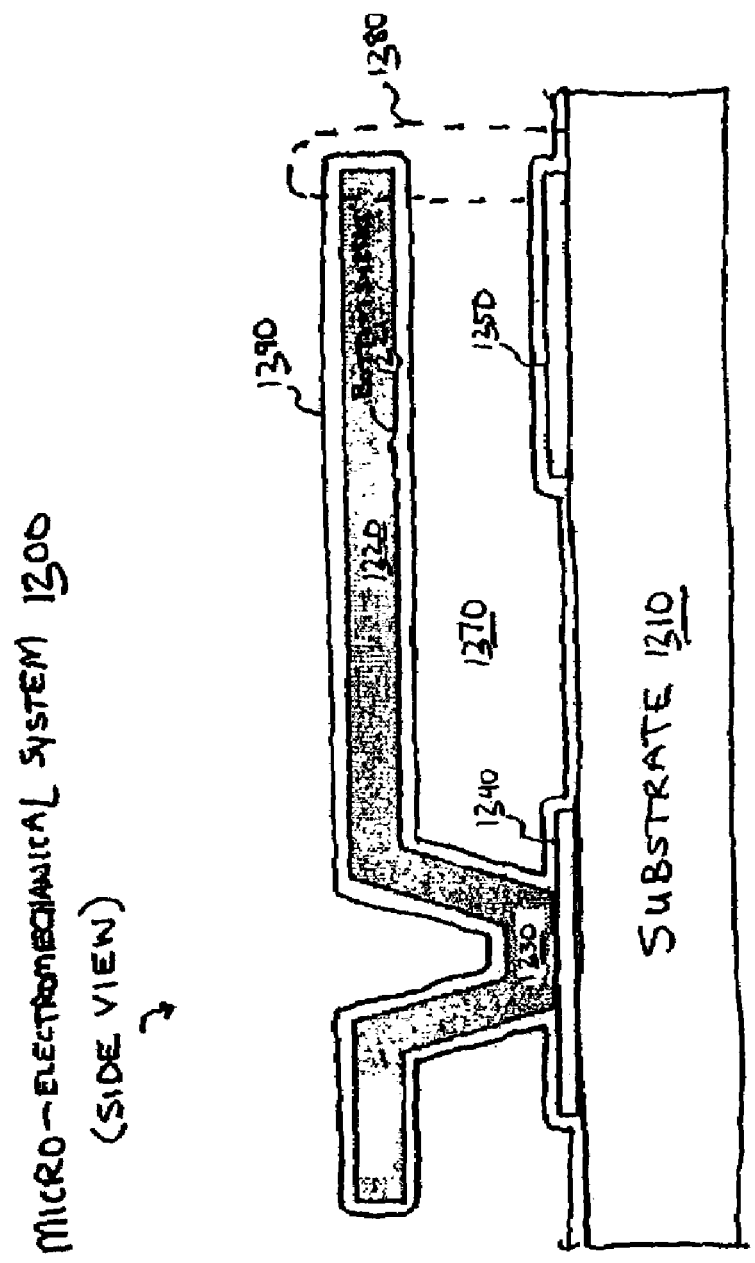
FIG. 13 shows an exemplary micro-mechanical device coated by ALD, according to one embodiment.

FIG. 13 shows a side view of a cantilever MEMS 1300 having a layer of $Al_2O_3$ deposited thereon by ALD. According to one embodiment, the layer may be deposited by the method of FIG. 11. Advantageously, the layer of $Al_2O_3$ may be sufficiently hard to reduce frictional wear to the MEMS 1300 and sufficiently dielectric to reduce electrical shorting to the MEMS 1300.

The device 1300 includes a cantilever beam 1320 having a bottom surface 1321 and enclosing a void 1370, a first polysilicon contact plate 1340, an anchor 1330 to fixedly attach the beam 1320 to the plate 1340, a second polysilicon contact plate 1340, a silicon substrate 1310 fixedly attached with the first plate 1340 and the second plate 1350, and a layer of $Al_2O_3$ 1390 deposited conformally and in substantially uniform thickness to an exposed outer surface of the device 1300 including the bottom surface 1321 and a housing of the void 1370. Advantageously, this ability to uniformly coat the bottom surface 1321 and other surfaces that are not in line-of-sight is not available using chemical vapor deposition or sputtering techniques.

Deposition of the $Al_2O_3$ layer may include reactively depositing $Al_2O_3$ on the layer by a first reactant that comprises aluminum (e.g., tri-methyl aluminum, $Al(CH_3)_3$) and a second reactant that comprises oxygen (e.g., water, $H_2O$). For example, the net deposition reaction may be as follows:

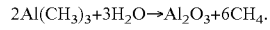

This reaction may proceed as two separate half reactions as follows:

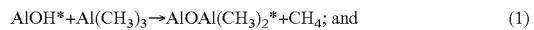

where the asterisks indicate a surface species attached by chemisorption. As shown in the above chemical equations, in the first reaction, the $Al(CH_3)_3$ molecules react with the surface hydroxyl groups to deposit a monolayer of aluminum atoms each terminated by methyl groups. In the second reaction, the methylated surface reacts with water ($H_2O$) vapor, thereby replacing the methyl groups with hydroxyl groups (OH). Methane ($CH_4$) is liberated in both reactions. Other reactants containing aluminum may also be used including but not limited to other reactants having the general structure $Al(R)_3$, where R represents an organic functional group, such as an alkyl group, preferably having less than five carbon atoms. The net result of one cycle, a first reaction and a second reaction, is the deposition of substantially one monolayer of $Al_2O_3$ onto the surface. Accordingly, deposition of $Al_2O_3$ may be accomplished to a surface having a suitable attachment for $Al(CH_3)_3$ by alternating between addition of $Al(CH_3)_3$ to bond the surface sites and $H_2O$ to react with the bound AlOAl $(CH_3)_2$*. Suitable attachments for $Al(CH_3)_3$ include silicon having an oxidized surface, surfaces having exposed OH species, and other surfaces.

Figure 14:
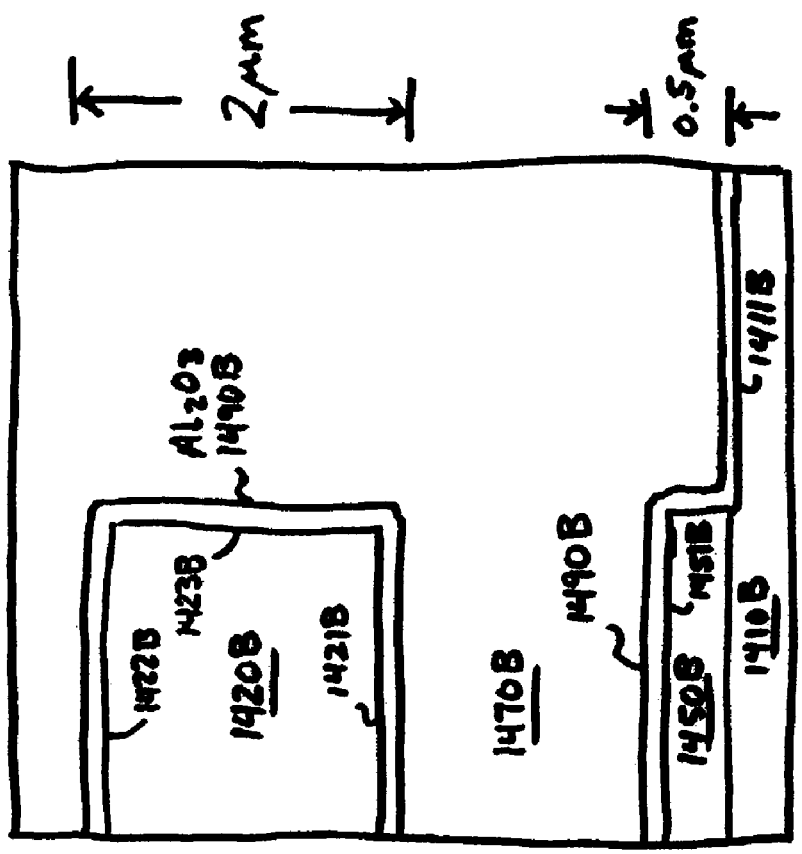
FIG. 14 shows a close-up view of the tip of the device shown in FIG. 13, according to one embodiment.

FIG. 14 shows an exemplary zoomed-in view 1480B of a tip region 1380 indicated in FIG. 13. The view 1480B includes a beam end 1420B, a void 1470B, a polysilicon contact plate 1450B, and a layer of $Al_2O_3$ 1490B deposited on a lower 1421B, upper 1422B, and an end 1423B surfaces of the beam 1420B, an upper surface 1451B of the plate 1450B, and an upper surface 1411B of the silicon substrate 1410B.

In this particular example, the layer 1490B has a thickness of about 0.08 microns and the coated beam 1420B (including two layer 1490B thickness) has a total thickness of about 2 microns, the coated polysilicon plate 1450B has a thickness of about 0.5 microns and similarly has a layer 1490B of about 0.08 microns deposited thereon, and the silicon substrate 1410B similarly has a layer 1490B of about 0.08 microns deposited thereon. These specific thickness are not required.

Example 4

Depositing a Thermally Conductive Layer on a Micro-Mechanical Device

Figure 15:
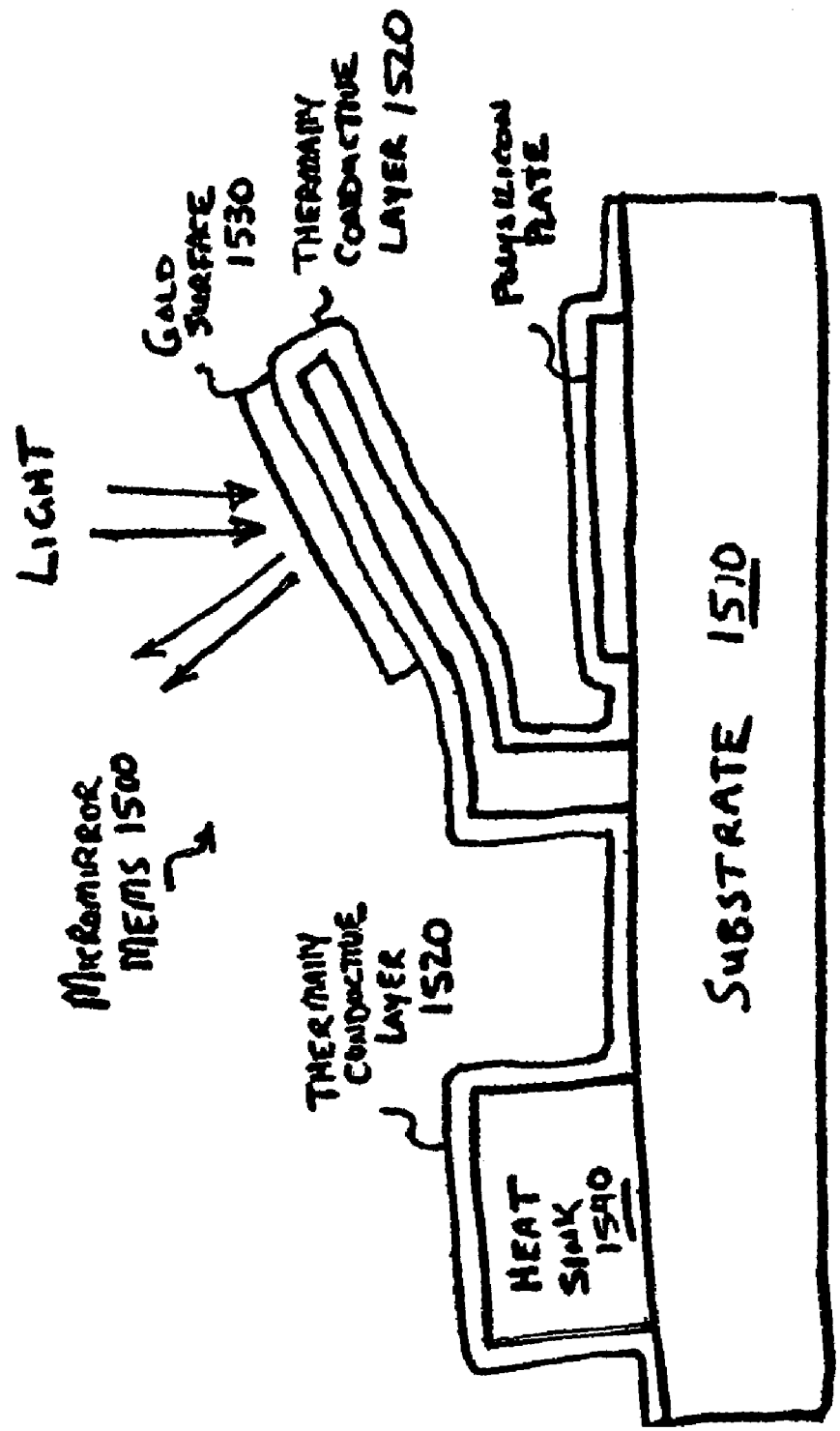
FIG. 15 shows a micro-mechanical device having a thermally conductive layer deposited by ALD, according to one embodiment.

FIG. 15 shows that a thermally conducting layer 1520 may be deposited on a micro-mechanical device 1500 to conduct heat away from the device 1500, according to one embodiment. The device 1500 is a micro-mirror, such as the one shown in FIG. 6, that may be used as a fiber optic router to redirect or route incident electromagnetic radiation data by bending a predetermined amount. The device 1500 has a bendable polysilicon mechanical component to bend. A layer 1520 having a higher thermal conductivity than polysilicon is deposited on the device 1500. Different materials are contemplated including metals such as aluminum, copper, silver, and others that have a higher thermal conductivity than polysilicon. The material may be deposited in an amount sufficient to increase the amount of conductive heat transfer by a desirable amount. For example, the thickness may be about 0.1 microns. Then a reflective surface 1530 such as gold is deposited on a top functional surface of the micro-mirror as shown. Advantageously, when the incident radiation heats up the reflective surface the layer 1520 may conduct and disperse the heat away from the device 1500 and toward a heat sink 1540 or toward a substrate 1510.

Example 5

Depositing a Hydrophobic Layer on a
Micro-Mechanical Device

Figure 16:
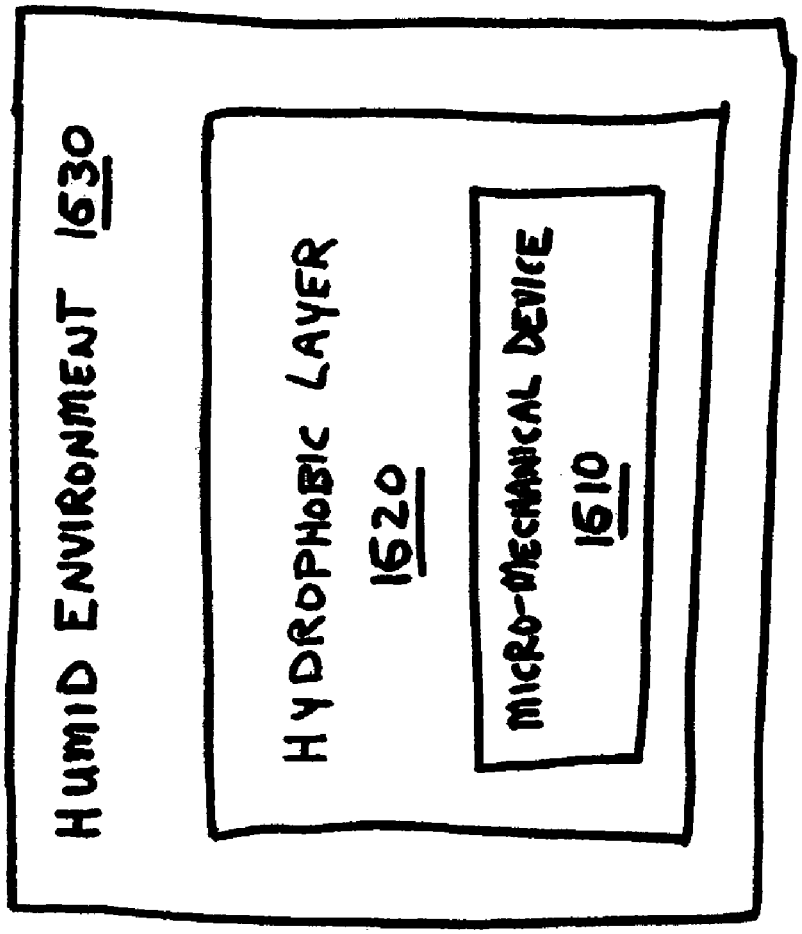
FIG. 16 shows a micro-mechanical device having a hydrophobic layer deposited by ALD, according to one embodiment.

FIG. 16 shows that a hydrophobic layer 1620 may be deposited on a micro-mechanical device 1610 by ALD to allow the device 1610 to be better used in a humid environment 1630. A hydrophobic layer dislikes water and consequently adsorbs less water than a hydrophilic layer. A wetting angle of a drop of water with respect to a flat surface is one measure of hydrophobicity. The wetting is determined by measuring the contact angle between the water drop and the solid surface and is a metric of surface tension. The wetting tendency is larger and the hydrophobicity smaller the smaller the contact angle.

Oxidized polysilicon is not very hydrophobic and has a small wetting angle of less than about 15° such as about 5°, depending upon the extent of oxidation. As a result, oxidized polysilicon is insufficiently hydrophobic for use in many humid environments where water deposited on the surface can increase stiction tendencies. Such stiction tendencies may be reduced and other advantages obtained by depositing a material that is more hydrophobic than the oxidized polysilicon. A material having a wetting angle for water of greater than about 20° or preferably greater than about 90° may be used. Advantageously, such a hydrophobic layer may serve as an anti-stiction coating to make use of the device 1610 more reliable in the humid environment 1630 by reducing water-induced stiction by presenting a surface that is less favorable to adsorption of water.

One approach for creating a hydrophobic surface is to expose a functional group of the surface to a reactant molecule having a first group operable to reactively attach to the functional group and a second hydrophobic group to reside on the surface and give the surface hydrophobic characteristics. Consider an exemplary organic-containing reactant that is more hydrophobic than polysilicon and that may be used to provide the hydrophobic layer 1630. Consider an exposed surface of the device 1610 that is terminated with AlOH* species, such as may result by the deposition of $Al_2O_3$ described above. Halosilane reactive attachment groups such as chlorosilane reactants having an organic compound such as an alkyl group ligand may be deposited readily onto such sites by ALD. Such organic groups are non-polar and hydrophobic, and will present a hydrophobic surface interface for the device. For example, consider the exemplary chlorosilane $ClSi(CH_3)_3$ and reaction:

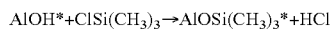

This reaction will leave the surface of the device terminated with methyl groups that provide a hydrophobic surface. This type of material may be used to expose a surface having a wetting angle greater than that of oxidized polysilicon such as greater than about 90°. Of course, this specific organic group is not required. Of course this particular organosilicon compound is not required. Other organic groups may also be used. For example, alkyl groups having between 2-10 carbon atoms may be used. Exemplary alkyl groups having between 2-10 carbon atoms include but are not limited to ethyl, propyl, butyl, isopropyl, and dodecyl. As another example, aryl groups, such as benzene or another group containing a six carbon aromatic ring, may also be used.

More hydrophobic surfaces still may be obtained by replacing hydrogen in the organic groups with halogens, such as fluorine or chlorine. For example, consider a halogen-containing material that contains halogenated organic alkyl ligands, such as $ClSi(CF_3)_3$. This reactant provides a hydrophobic surface approaching that provided by Teflon. This type of material may be used to create a hydrophobic surface for a micro-device having a wetting angle of about 110°.

The use of chlorine as a leaving group is not required. An alternate chemistry utilizes an amine, such as $N(CH_3)_2$—as a leaving group. The amine leaving group may be attached to any desired hydrophobic organosilicon compound, for example—$Si(CH_3)_3$. This compound may react with an AlOH* terminated surface of a micro-mechanical device according to the reaction: AlOH*+$N(CH_3)_2$ $Si(CH_3)_3$→AlOSi$(CH_3)_3$+$NH(CH_3)_2$.

Those having an ordinary level of skill in the art and the benefit of the present disclosure will appreciate that the approaches discussed above are not limited to creating hydrophobic surfaces and in fact are more generally applicable to creating a surface having a desired wetting angle with respect to a drop of a particular liquid. Rather than water this liquid could include an oil, a lipid, a biological fluid, or another. For example, in a microfluidic MEMS to move hydrophilic biological fluid it may be desirable to deposit a layer of hydrophilic material such as $SiO_2$ to provide for good flow through small channels.

Example 6

Depositing a Biocompatible Layer on a
Micro-Mechanical Device

Figure 17:
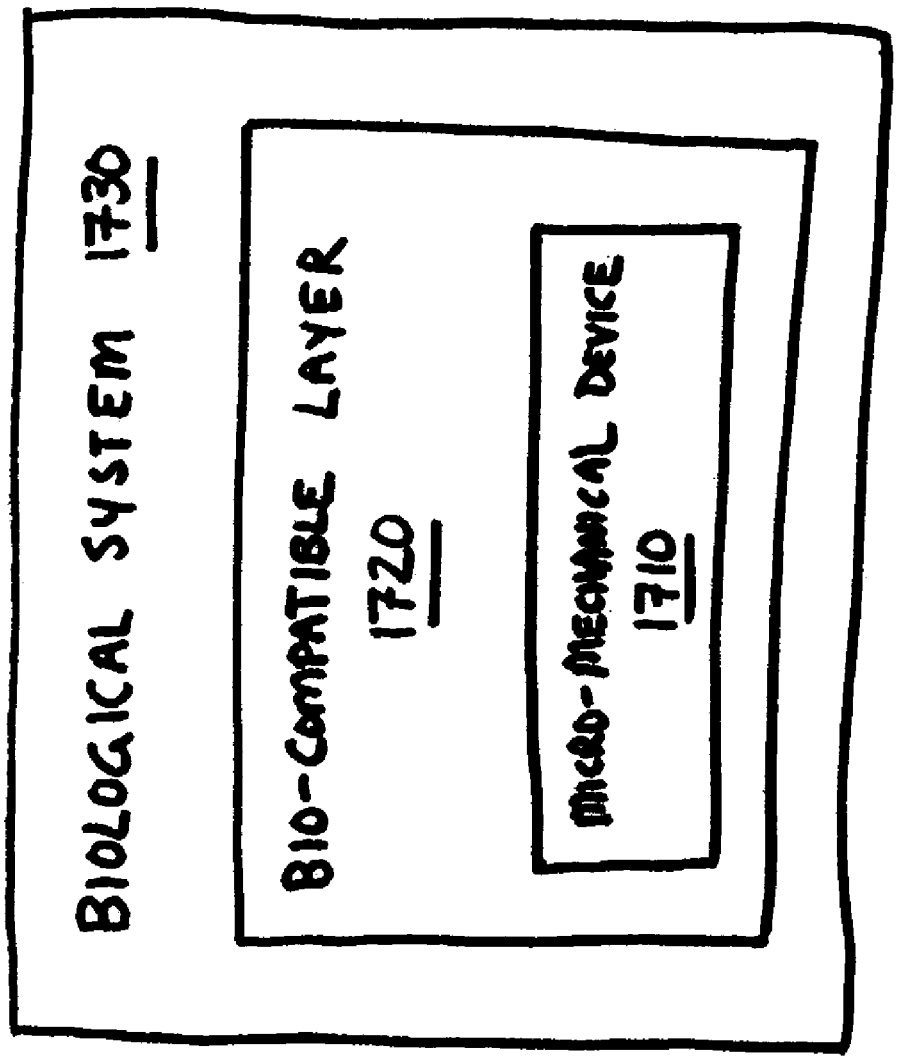
FIG. 17 shows a micro-device having a biocompatible layer deposited by ALD, according to one embodiment.

FIG. 17 shows that a biocompatible layer 1720 may be deposited on a micro-mechanical device 1710 by ALD to allow the device 1710 to be better used in a biological system 1730. The term biological system will include in vivo systems (within a living system such as a human, an animal, a cell, or a membrane) and systems in contact with biological fluids associated with living systems (e.g., blood from humans, DNA from cells, etc.).

Different layers 1720 are contemplated for different implementations and devices 1710. In one embodiment, the layer 1720 may protect against corrosion from the biological system. This may include chemical attack wherein the biological system has chemical species that react with the material of the micro-device as well as biological fouling wherein the biological system has a chemical or biological species that attaches to the surface of the micro-device and impedes performance.

Consider an example micro-mechanical device having a polysilicon portion and a material having a greater biocompatibility is deposited thereon by ALD to protect the polysilicon portion from corrosion from the biological system. Materials having a higher biocompatibility than polysilicon include titanium (Ti), titanium nitride (TiN), titanium dioxide ($TiO_2$), silicon dioxide ($SiO_2$), aluminum oxide ($Al_2O_3$), tantalum nitride (TaN), or others. Advantageously, this may make the device more amenable to use in vivo, such as for drug delivery or diagnosis.

Considering further the deposition of titanium dioxide, it may proceed as two separate half reactions as follows, where $TiCl_4$ is a titanium containing reactant known as tetrachlorotitanium and HCl is hydrochloric acid:

$$TiOH^* + TiCl_4 \rightarrow TiOTiCl_3^* + HCl \quad (1)$$

$$TiCl^* + H_2O \rightarrow TiOH^* + HCl \quad (2)$$

Example 7

Figure 18:
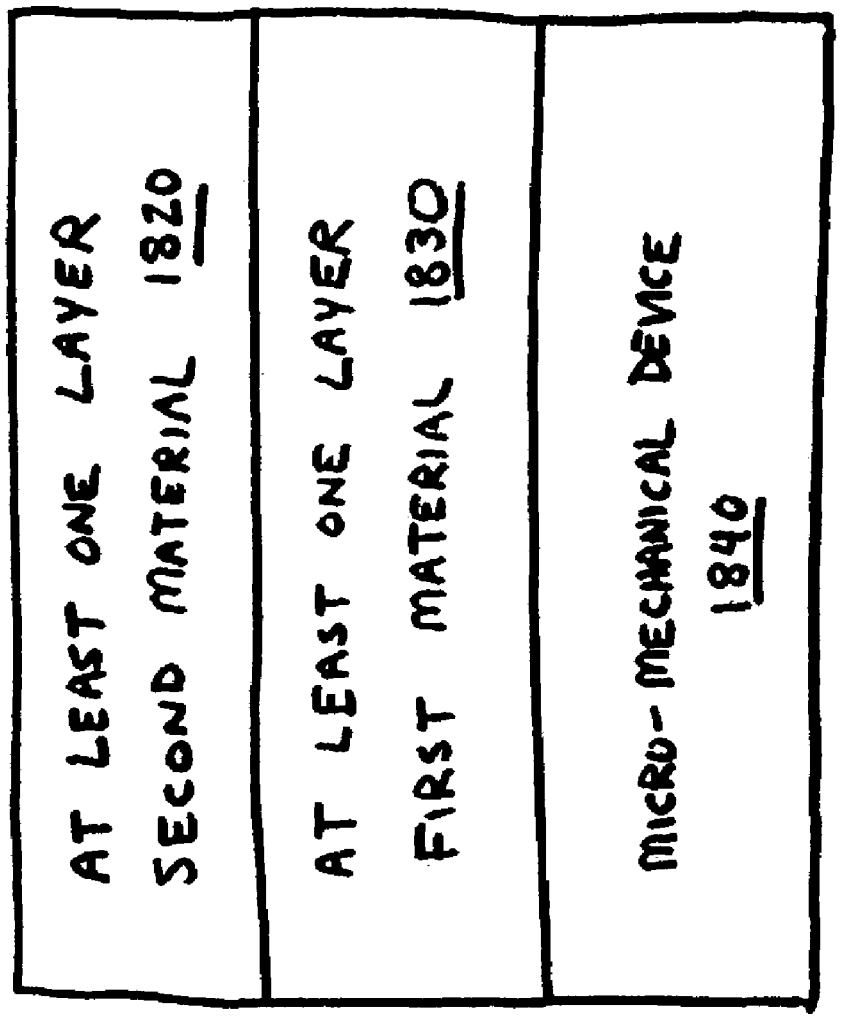
FIG. 18 shows a micro-device having a laminate layer of multiple materials deposited by ALD, according to one embodiment.

Depositing a Laminate Containing Different Materials on a Micro-Mechanical Device FIG. 18 shows that a multi-material laminate layer 1810 may be deposited on a micro-device 1840 by using atomic layer deposition, according to one embodiment. The layer 1810 comprises at least one layer of a first material 1830 deposited directly on the micro-device 1840 and at least one layer of a second material 1820 deposited directly on the at least one layer of a first material 1830. The layer 1810 may be created by using a first pair of a first reactant and a second reactant for the layer 1830 and a second pair of a third reactant and a fourth reactant for the layer 1820, the third and fourth may be different from the first and second. Alternatively, either of the layers 1820 or 1830 may be created from a single reactant, such as $ClSi(CH_3)_3$. Layers 1820 and 1830 may be repeated n-times such that the laminate layer 1810 is a many-layered stack with 2n total layers. There is no requirement that there be an even number of layers. Additionally, there is no requirement that only two materials be used. Three, four, or any desired number of different materials may be used for the different layers. Either of the layers 1820 and 1830 may have any of the characteristics discussed elsewhere, including the conformality to geometry of the micro-device 1840, customizable thickness, and other characteristics. The laminate layer 1810 may also have other layers and other materials.

Different combinations are contemplated in which a first layer and a second (and optionally other layers) perform such functions as providing electrical insulation, providing thermal conduction, providing mechanical strength, providing a hydrophobic surface, providing a biocompatible surface, and others.

Figure 19:
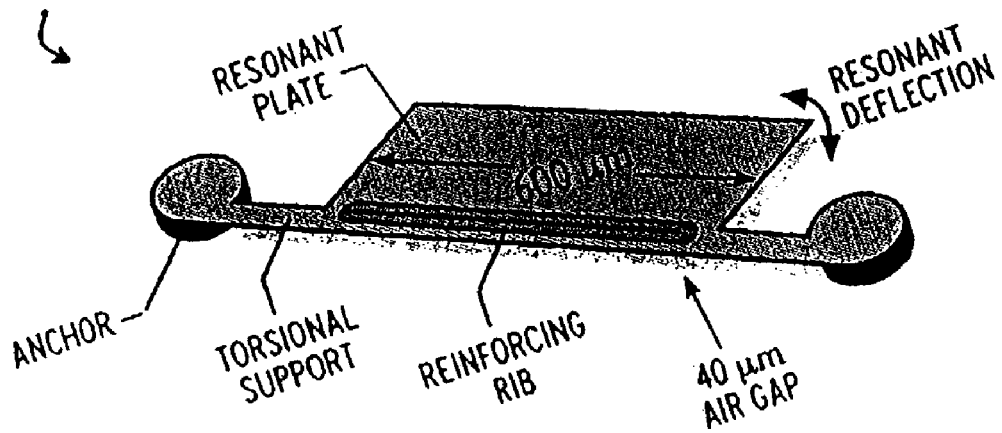
FIG. 19 shows an exemplary MEMS having a multifunctional laminate of materials deposited by ALD, according to one embodiment.
Figure 19:
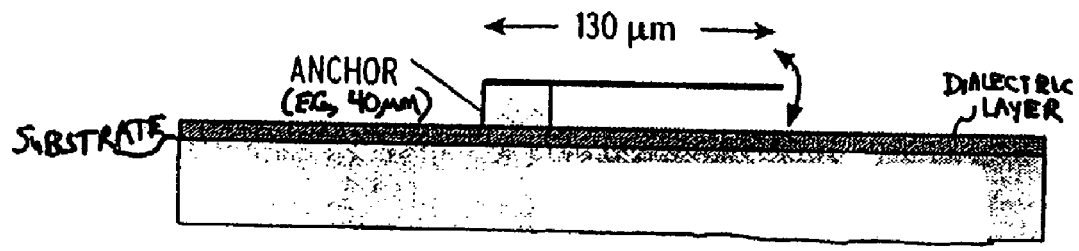

FIG. 19 shows an example of a MEMS having a laminate layer deposited thereon by ALD including an inner layer to electrically insulate the resonant plate from the environment and an outer layer that is substantially biocompatible. The inner layer may comprise a layer of $Al_2O_3$ having a thickness of about 0.1 microns. The outer layer may comprise a layer of $TiO_2$ having a thickness of about 0.02 microns. These particular thickness are not required. In particular, the thickness of the electrically insulating layer may depend upon the voltages used in the MEMS and the thickness of the biocompatible layer may depend upon how long the MEMS is to be used in contact with the biological fluid. Larger thickness is generally acceptable as long as they do not become so large that they interfere with device operation. Advantageously, the inner layer may keep a voltage associated with the device from affecting a fluidic environment (e.g., may prevent hydrolysis of water) and the outer layer may make the device more useful in a biological system.

Example 8

Depositing Laminates Containing $Al_2O_3$ and ZnO

According to a first embodiment, the laminate layer 1810 may be a composite, blend, or alloy of two materials to obtain laminate having a property or characteristic which is different than that of either material and which is more desirable for an intended application of the layer to a micro-device. The composite blend or alloy may comprise a plurality of interdispersed different materials that together have a blended set of properties that are typically intermediate between the independent properties.

In one example, the layer 1830 may comprise $Al_2O_3$, or another electrical insulator, and the layer 1820 may comprise an oxide of zinc (e.g., zinc oxide, ZnO), or another electrical conductor, to achieve a laminate layer having electrical characteristics that are different from those of either $Al_2O_3$ or ZnO. Both $Al_2O_3$ and ZnO may be deposited by using ALD. An example method for depositing $Al_2O_3$ has been discussed above. ZnO may be deposited by a method including a net deposition reaction:

$$Zn(CH_2CH_3)_2 + H_2O \rightarrow ZnO + 2CH_3CH_3$$

Which may be divided into a binary reaction sequence of two separate half-reactions as follows:

$$ZnOH^* + Zn(CH_2CH_3)_2 \rightarrow ZnOZnCH_2CH_3^* + CH_3CH_3 \quad (1)$$

$$ZnCH_2CH_3^* + H_2O \rightarrow ZnOH^* + CH_3CH_3 \quad (2)$$

The $Zn(CH_2CH_3)_2$ is an exemplary reactant that comprises zinc and may be replaced by other reactants that comprise zinc, for example $Zn(R)_2$, where R represents an alkyl group having for example 1 or 3-5 carbon atoms.

The present inventors have used ALD to create compositions containing various proportions of $Al_2O_3$ and ZnO. The empirical formula, taken either over the laminate or the mixed layer, is $Al_xZn_yO_z$, where x, y, and z may have integer or non-integer values, depending upon the relative proportions of $Al_2O_3$ and ZnO in the composition.

Figure 20:
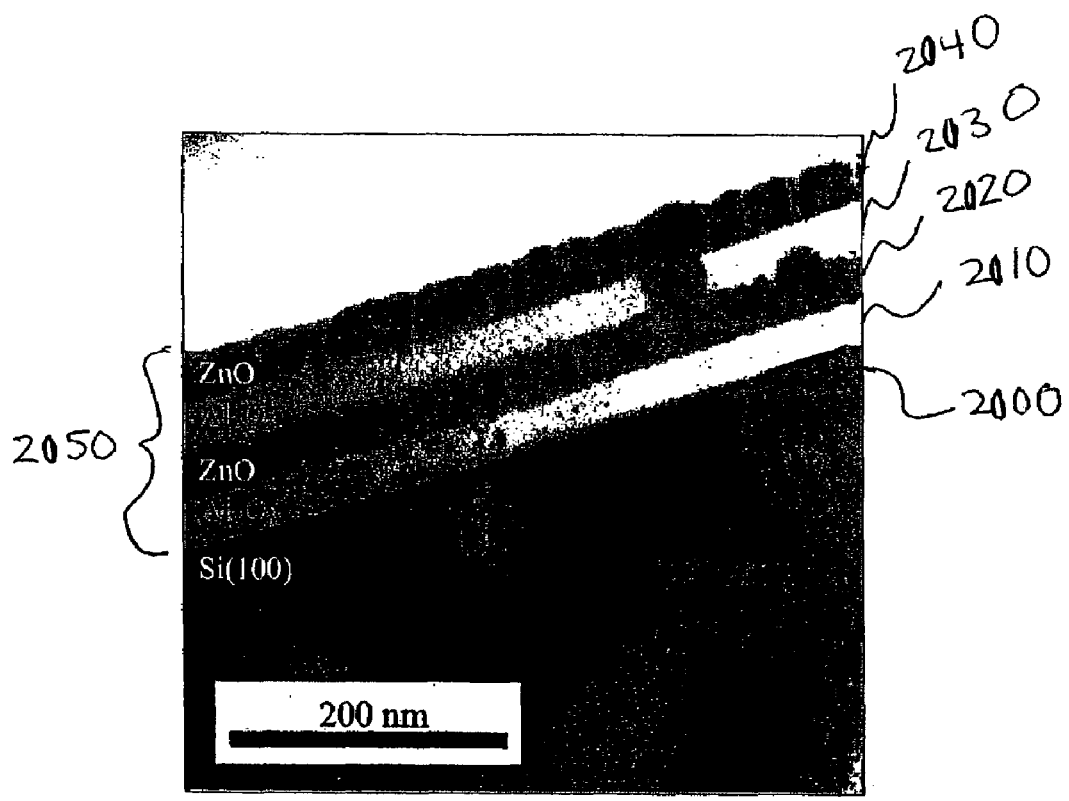
FIG. 20 shows a cross-sectional microscopic view of a four-layer laminate deposited on a surface portion of a micro-mechanical device by ALD, according to one embodiment of the invention.

In one embodiment of the invention laminates of alternating layers of $Al_2O_3$ and ZnO may be created by alternating between depositing layers of $Al_2O_3$ and ZnO to achieve a desired laminate layer that has blended intermediate properties between those of $Al_2O_3$ and ZnO. FIG. 20 shows a cross-sectional microscopic view, taken with Transmission Electron Microscopy, of a four-layer laminate 2050 deposited on a Si(100) surface portion of a micro-mechanical device 2000 by ALD, according to one embodiment of the invention. The laminate 2050 contains a first $Al_2O_3$ layer 2010 deposited directly on the surface portion of the device, a second ZnO layer 2020 deposited directly on the first $Al_2O_3$ layer, a third $Al_2O_3$ layer 2030 deposited directly on the second ZnO layer, and a fourth ZnO layer 2040 deposited directly on the third $Al_2O_3$ layer. The first and the third $Al_2O_3$ layers are shown in white. Any desired number of cycles may be used to obtain the $Al_2O_3$ and the ZnO layers, so that each of the layers may have a desired, customizable thickness, which is suitable for the particular implementation. This can be achieved by varying the number of individual $Al(CH_3)_3$ or $Zn(CH_2CH_3)_2$ exposures used with the alternating $H_2O$ exposures. In the particular laminate illustrated, approximately 250 binary reaction sequence cycles were used to form the first and the third $Al_2O_3$ layers and approximately 150 binary reaction sequence cycles were used to form the second and the fourth ZnO layers. Each of the layers have a thickness in the range of approximately 30-40 nm. These particular thickness are not required. In other embodiments, alternating layers may be formed of a smaller number of binary reaction sequence cycles, such as less than 10, or less than 20, to obtain more "mixing" of the two materials. As shown, the ALD layers are highly conformal, uniform in thickness, pinhole free, and have excellent adhesion to the underlying Si(100) surface. Additionally, the cyclic and self-limiting nature of the depositions makes the uniformity and thickness control far superior to most other deposition processes, including CVD and PVD.

In another embodiment of the invention, blends, composites, or alloys of $Al_2O_3$ and ZnO may be created by using ALD to deposit $Al_2O_3$ and ZnO within one cycle, or one half cycle, of an ALD deposition. That is, two or more different materials may be mixed within a common ALD deposited monolayer. This may include adding a first reactant that comprises aluminum (e.g., tri-methyl aluminum, $Al(CH_3)_3$) and a second reactant that comprises zinc within a common deposition half cycle and then adding a third reactant that comprises oxygen (e.g., water, $H_2O$) in the following half cycle. The third reactant may react with both the first reactant and the second reactant to produce $Al_2O_3$ and ZnO, respectively, within the same deposited monolayer. This approach is not limited to $Al_2O_3$ and ZnO and in general two materials having different or contrasting chemical, electrical, or mechanical properties may be mixed within an ALD deposited monolayer by this method.

By using ALD to vary the relative proportions of $Al_2O_3$ and ZnO compositions having very wide ranging properties and uses may be created. ZnO is much more conductive than $Al_2O_3$, which is a good dielectric insulator. By varying the ZnO content in the ZnO/$Al_2O_3$ layer, either with a layer or by providing thin adjacent layers, an electrical property such as conductivity, resistivity, or dielectric constant of the composition may be accurately controlled and varied over many orders of magnitude (e.g., approximately 20).

Figure 21:
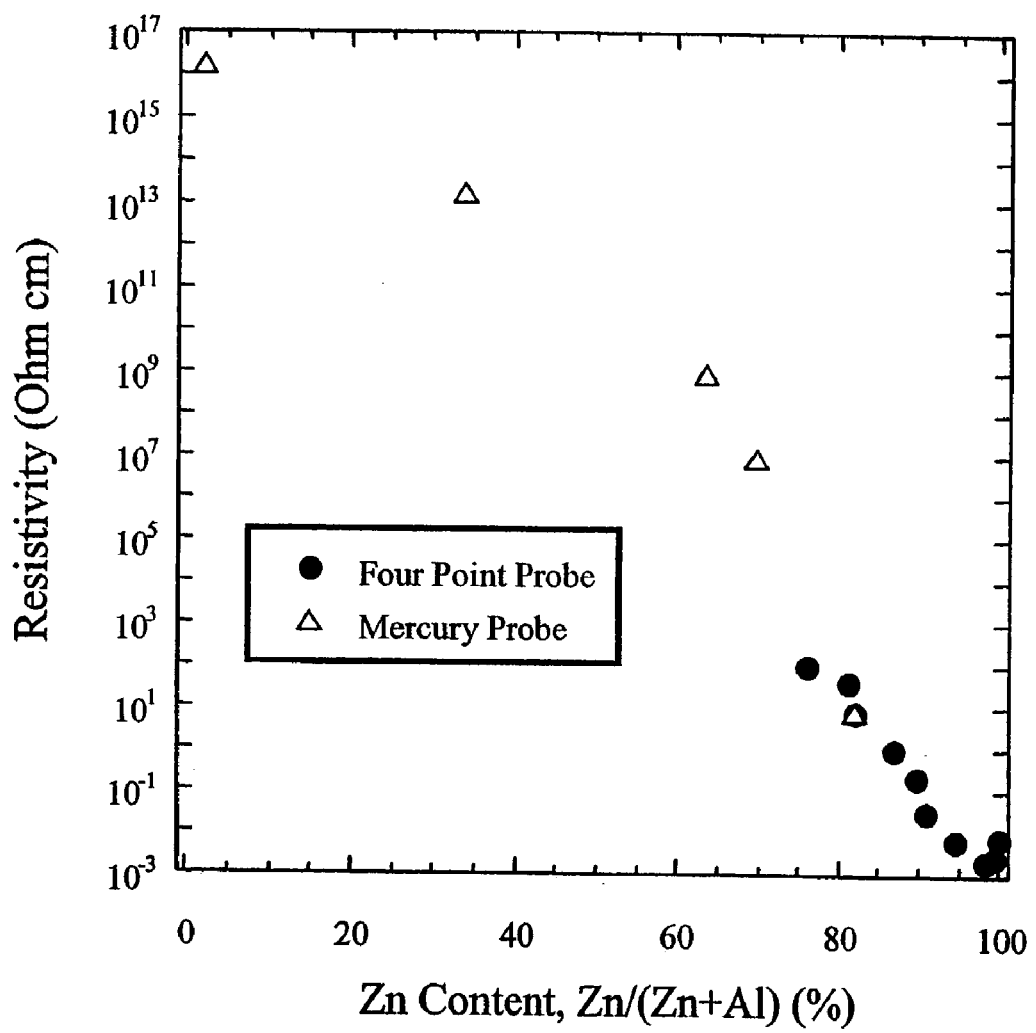
FIG. 21 shows that resistivity of a ZnO/Al2O3 composition may be varied by approximately twenty orders of magnitude by varying the Zn content of the composition, according to one embodiment of the invention.

FIG. 21 shows that resistivity of a ZnO/$Al_2O_3$ composition may be varied by approximately twenty orders of magnitude by varying the Zn content of the composition, according to one embodiment of the invention. The horizontal axis plots the overall Zn content of the ZnO/$Al_2O_3$ composition as calculated by the relation Zn/(Zn+Al)*100. The percent Zn content was determined using atomic emission spectroscopy elemental analysis after dissolving small portions of each film in hydrofluoric acid. The vertical axis plots resistivity of the composition in Ohm-cm. The solid circles represent the resistivity of the ZnO/$Al_2O_3$ alloy layers deposited on glass substrates and measured using a four point probe technique. The resistivity of the pure ZnO films is approximately $8 \times 10^{-3}$ Ohm-cm. In this set of data, the resistivity decreases for small additions of Al until it reaches an apparent minimum value of approximately $2 \times 10^{-3}$ Ohm-cm at approximately 98% Zn, after which, the resistivity increases with additional Al content. The ZnO/$Al_2O_3$ alloy resistivity increases to approximately $1 \times 10^2$ Ohm-cm for films containing approximately 75% Zn. Due to the low conductivity of ZnO/$Al_2O_3$ ALD layers with Zn contents less than approximately 75% a mercury microprobe and picoammeter was used to measure current voltage measurements instead of a four-point probe. Referring again to the figure, the open triangles represent the resistivity values derived from the mercury probe current-voltage measurements for five ZnO/$Al_2O_3$ alloy layers containing approximately 82, 70, 64, 34 and 2% Zn deposited on n-doped Si(100) substrates. The 82% Zn layer exhibited a resistivity of approximately 80-hm-cm. The resistivity increases nearly exponentially with decreasing Zn content to approximately $1.5 \times 10^{16}$ Ohm-cm at approximately 2% Zn.

Such ability to control, and accurately control, the resistivity of the composition may allow customizing the electrical properties of a dielectric or other layer for a micro-mechanical device and application. Such customizable layers have not heretofore been available for MEMS devices, which are often used in diverse environments and for diverse uses, which make such customization extremely attractive.

The approach is not limited to ZnO and $Al_2O_3$. Other materials having different or contrasting electrical, mechanical, or chemical properties may also be used. The inventors contemplate an even greater range of electrical properties may be achieved if the pair contains a conductive metal and an insulating metal oxide. For example, W and $Al_2O_3$, Cu and $Al_2O_3$, or Cu and a nitride of silicon (e.g., $Si_xN_z$ where x and z are integers). Other examples of pairs of materials that may be useful include but are not limited to Si and $TiO_2$, Si and $Si_xN_z$, $Si_xN_z$ and $TiO_2$, $Si_xN$, and TiN, and TiN and $TiO_2$.

Example 9

Depositing Rough and Smooth Layers on Micro-Mechanical Devices with ALD

ALD may be used to deposit either rough or smooth layers on micro-mechanical devices. Experiments by the inventors indicate that the roughness of an ALD layer may increase with increasing crystallization. When a material within a layer crystallizes, the arrangement of the matter into crystallites increases the roughness of the layer. On the other hand, when the layer is amorphous and lacks crystals, it is flat and smooth. The inventors contemplate using ALD to deposit a crystalline material to provide a rough layer and an amorphous material to provide a smooth layer.

The surface roughness may be controlled at a predetermined value that is convenient for the operation of the device. As one example, a rough surface may be used to reduce the fraction of two surfaces that touch when they come into contact with one another and thereby reduce stiction between the contacting surfaces. In this way, the rough layer may serve a similar function as a structural dimple used in a MEMS device to reduce stiction between contacting surfaces. As a second example, a smooth surface may be used in a reflector for a micro-mechanical mirror device in order to increase the reflectivity.

The inventors have explored a number of methods for controlling the crystallization, and therefore the roughness, of an ALD layer. In one method, deposition temperature may be used to either increase or decrease roughness. Higher temperatures tend to promote crystallization and increased roughness. Accordingly, in an embodiment of the invention, a smooth layer may be formed by a low temperature ALD deposition or a rough layer may be formed by a high temperature ALD deposition. It should be kept in mind that the affect of temperature on crystallization may depend upon the particular material in the layer.

In another method, nucleation time may be used to either increase or decrease roughness. The roughness decreases when the nucleation time decreases. Longer nucleation times tend to promote crystallization and increased roughness. Accordingly, in an embodiment of the invention, a smooth ALD layer may be formed by a low nucleation time process or a rough ALD layer may be formed by a high nucleation time process. A long nucleation time may be achieved by a long cycle time for one of the binary sequences, by allowing a long time between cycles, or by carrying out an anneal either between cycles or at the end of an ALD deposition. As an example, experiments indicate that W nucleation time on Al2O3 is decreased when the W ALD cycle is finished by $WF_6$ instead of $Si_2H_6$. The W nucleation time on $Al_2O_3$ is also decreased when the $Si_2H_6$ dosing time is increased. In addition, roughness is decreased when decreasing $WF_6$ dose time.

In another method, layer thickness may be used to either increase or decrease the extent of crystallization. Thicker layers tend to have increased roughness because they allow larger crystal sizes. Accordingly, in an embodiment of the invention, a low roughness ALD layer may be formed by depositing a thin layer or a high roughness ALD layer may be formed by depositing a thick layer.

In another method, a dopant may be mixed with a primary material in an ALD layer to modify the crystallinity of the primary material and increase or decrease the roughness. Additives to increase and decrease crystallinity of materials are known in the arts. A sufficient amount of additive is generally in the range of approximately 1-10 mole %. For example, about 1-10 mole % of a metal such as hafnium, or another metal having an atomic radius that is approximately 20-30% larger than that of zinc, may be added to a ZnO layer to reduce crystallinity by interfering with the formation and propagation of the ZnO crystal lattice structure.

In yet another method, materials having different roughness or crystallinity may be mixed in a layer or laminate to either increase or decrease roughness. A predetermined surface roughness may be obtained by mixing predetermined proportions of a relatively rough material and a relatively smooth material with ALD. Experiments by the present inventors indicate that surface roughness may be controlled or customized by blending or alternating between depositing layers of $Al_2O_3$ and ZnO. ZnO ALD layers, which are believed to be crystalline, provide rougher films compared to $Al_2O_3$ films, which are believed to be amorphous. As an example, an $Al_2O_3$ ALD layer generated from 1000 binary cycles may have a roughness of approximately 0.3 nanometers while a ZnO ALD layer generated from an equal number of binary cycles may have a roughness of approximately 3 nanometers. Thus, a crystalline material, such as ZnO, may be deposited as an outermost layer to provide a rough layer, or an amorphous material, such as Al2O3, may be deposited as an outermost layer, to provide a smooth layer.

These various approaches may be used individually, or in combination, to achieve a desired predetermined surface roughness. Such control and customization of surface roughness may be used to create rough surfaces that experience reduced adhesion during operation. Such control and customization of surface roughness may also be used to create smooth surfaces that allow high reflectance. This may be used in combination with controlling the electrical conductivity. Advantageously, this makes it possible to deposit a laminate layer 1810 having properties and characteristics that are highly suitable to an intended use.

Example 10

Depositing a Reflective Layers for an Electromagnetic Radiation on a Micro-Mechanical Device An embodiment of the invention relates to a micro-mechanical device containing a reflector for electromagnetic radiation. The micro-mechanical device may have an electrically moveable component having a surface portion that may be moved by an electromechanical system and the reflector may contain at least one ALD layer overlying the surface portion. As desired, an electrically insulating layer may be disposed between the surface portion of the component and the reflector. The reflector may be a single reflective ALD layer containing a material that is reflective to the electromagnetic radiation. Alternatively, the reflector may be a reflective laminate that contains a plurality of layers including at least one ALD layer. Each of the plurality of layers may contain different materials with different or contrasting properties, such as refractive index, atomic weight, or dielectric constant. The reflective laminate may contain a layer that has a thickness to reflect a first portion of an electromagnetic radiation, which is incident to a first interface formed between the layer and an overlying layer substantially in phase with a second portion of an electromagnetic radiation, which is incident to a second interface formed between the layer and an underlying layer. The reflector may be sufficient to reflect infrared radiation, visible radiation, ultraviolet (UV) radiation, extreme ultraviolet (EUV) radiation, X-ray radiation, soft X-ray (SXR) radiation, or other desired radiations. In some embodiments the reflector may reflect visible radiation and may be included in a projector, display device, television, fiber optic router, or lithography system. In other embodiments the reflector may reflect extreme ultraviolet radiation or soft x-ray radiation and may be included in a lithography system for manufacturing micro-electronic devices. Another embodiment of the invention relates to a method of forming a reflector on a surface portion of a micro-mechanical device by depositing at least one layer by ALD. Another embodiment of the invention relates to a method of using a reflector of a micro-mechanical device to reflect radiation. The reflector may be used to form a reflective pattern for a lithography system.

Figure 22:
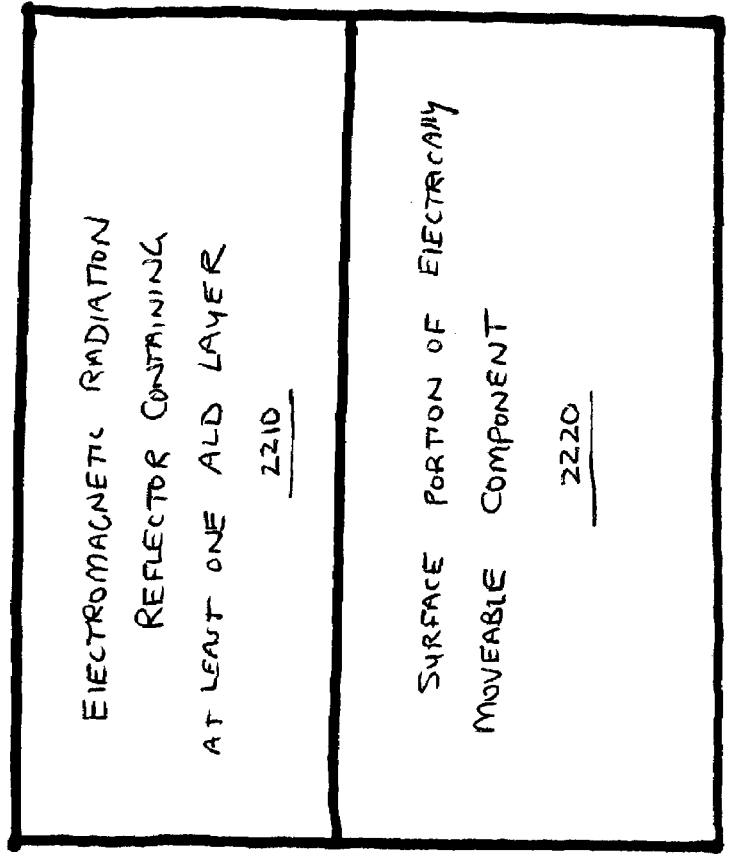
FIG. 22 shows a micro-mechanical device containing an electromagnetic radiation reflector, which contains at least one ALD layer, attached to a surface portion of an electrically moveable component of a micro-mechanical device, according to one embodiment of the invention.

FIG. 22 shows a micro-mechanical device 2200 containing an electromagnetic radiation reflector 2210, which contains at least one ALD layer, attached to a surface portion of an electrically moveable component 2220, according to one embodiment of the invention. The surface portion of the moveable component represents a boundary of the component, where the material of the moveable component ends, and where materials of overlying layers begin. The surface portion of the electrically moveable component may be moved by an electromechanical system (not shown) of the micro-mechanical device. The surface portion provides a support surface for the reflector and allows the reflector to be moved and positioned. Various suitable electromechanical systems and moveable components are shown and described elsewhere herein. For example, the cantilever beam and contact shown in FIG. 1, the moveable plate and hinge shown in FIG. 4, and the electrostatic actuators of the plates shown in FIGS. 6 and 7 are suitable. Other suitable electromechanical systems and moveable components are known in the arts.

The electromagnetic radiation reflector contains at least one ALD layer. In one embodiment of the invention, the reflector may comprise a single ALD layer. The single layer may comprise a material that is reflective to a particular electromagnetic radiation. For example, materials that are reflective to visible radiation, and that may be deposited by ALD, include among others aluminum (Al), copper (Cu), silver (Ag), and platinum (Pt). Those skilled in the arts may select other materials that are reflective to a particular radiation and that may be deposited by ALD. The layer may have a thickness that is not less than the well-known reflective skin depth. The reflective skin depth increases with electrical conductivity of the material and decreases with increasing wavelength of the radiation. As one example, a layer of tungsten to reflect light of 400 nm wavelength would desirably be not less than approximately 3 nm thickness, which is the approximately skin depth for tungsten at this wavelength. A thinner layer may be used if less reflectance is acceptable for the particular implementation. Micro-mechanical devices having such reflectors for visible radiation may be incorporated into projectors, display devices, televisions, fiber optic routers, lithography system, and other systems.

Figure 23:
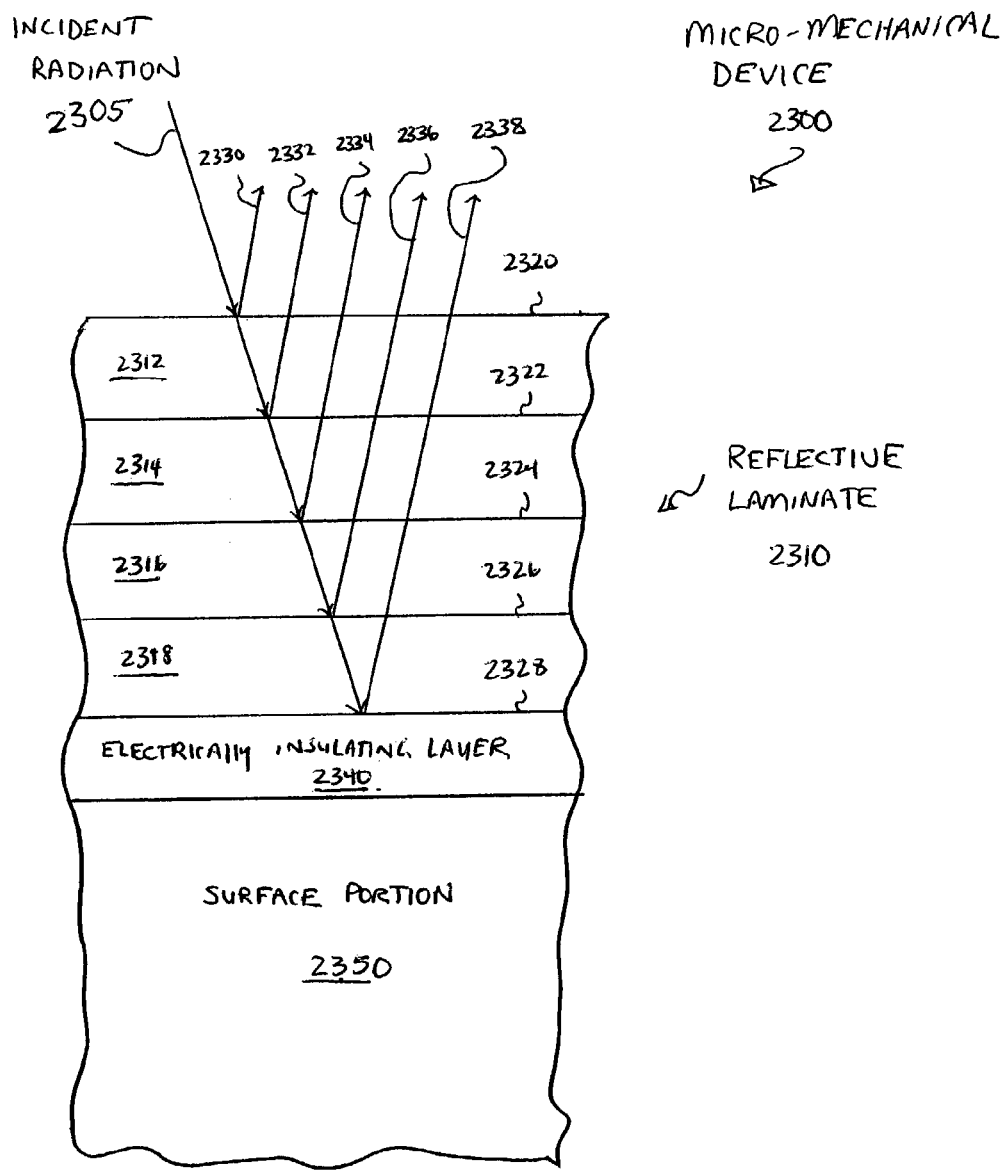
FIG. 23 shows a micro-mechanical device containing a reflective laminate layer, an electrically insulating layer, and a surface portion of the micro-mechanical device, according to an embodiment of the invention.

In another embodiment of the invention the reflector may comprise a reflective laminate layer that contains multiple layers including at least one ALD layer. FIG. 23 shows a micro-mechanical device 2300 containing a reflective laminate layer 2310, an electrically insulating layer 2340, and a surface portion 2350 of the micro-mechanical device, according to an embodiment of the invention. The electrically insulating layer is formed on the surface portion, for example by ALD, and the reflective laminate is formed on the electrically insulating layer. The illustrated electrically insulating layer is optional, and in an alternate embodiment of the invention the laminate may be formed on the surface portion.

The reflective laminate layer is a multi-layered structure containing a plurality of layers 2312-2318. Embodiments of reflective laminates, such as Distributed Bragg Reflectors (DBRs) and dielectric mirrors, are known in the arts. The laminate may contain at least two layers, at least three layers, at least four layers, at least five layers, at least six layers, at least ten, at least 20, at least 40, or any desired number of layers. Generally, more layers improve reflectance, at least to a point. The particular reflector illustrated contains a first topmost layer 2312, a second layer 2314 directly under the first layer, a third layer 2316 directly under the second layer, and a fourth bottommost layer 2318 directly under the third layer. At least one of the layers, a plurality of the layers, any desired number of layers, or all of the layers, may be deposited by ALD in order to take advantage of ALDs good thickness control, conformality, and smoothness.

An external environment and the first layer form a first interface 2320, the first layer and the second layer form a second interface 2322, the second layer and the third layer form a third interface 2324, the third layer and the fourth layer form a fourth interface 2326, and the fourth layer and the electrically insulating layer form a fifth interface 2328. In combination, the plurality of layers reflect an incident electromagnetic radiation 2305. In particular, the first interface reflects a first portion 2330, the second interface reflects a second portion 2332, the third interface reflects a third portion 2334, the fourth interface reflects a fourth portion 2336, and the fifth interface reflects a fifth portion 2338.

The first and the second layers, the second and the third layers, and the third and the fourth layers are adjacent layers. In an embodiment of the invention, the layers in the reflective laminate may have different, dissimilar, or contrasting properties. Adjacent layers may have dissimilar properties, such as contrasting refractive index, so that radiation incident to an interface between the adjacent layers may be reflected. The refractive index, or index of refraction, quantifies the ratio of the speed of electromagnetic radiation in one material to that in another material. A difference in refractive index at an interface may give rise to a reflection at that interface. A given layer may have a particular refractive index and adjacent layers on either side of the given layer may have higher refractive indices. A given layer may have a low refractive index, for example not greater than approximately 1.5, and one or more adjacent layers may have high refractive indices, for example greater than approximately 1.5. The refractive indices of adjacent layers may be contrasting. The difference or degree of contrast between the refractive index of the different layers may depend upon the particular wavelength. Examples of pairs of materials, with well known refractive index, having contrasting refractive indices sufficient to reflect different types of radiation are discussed elsewhere herein.

The refractive index and the dielectric constant of a material are related. One of the alternating layers may contain a dielectric or insulating material and another adjacent alternating layer may contain a different dielectric constant material, a non-dielectric material, a semiconductor, a metal, or other materials. The index of refraction is also related to atomic number. Atomic number is often used by practitioners when referring to the EUV or SXR refraction of a material, since the refractive index of many materials in these radiations are close to unity. Accordingly, one layer may have a material with a high atomic number, for example greater than 40, and one or more adjacent layers may have a materials with a low atomic number, for example not greater than 40. For example, one layer may contain tungsten having an atomic layer of approximately 74 and another layer may contain carbon having an atomic number of approximately 6. As another example, one layer may contain molybdenum having an atomic layer of approximately 42 and another layer may contain silicon having an atomic layer of approximately 14. Accordingly, one or more pairs of adjacent layers may have different or contrasting optical properties, as measured by refractive index, dielectric constant, or atomic number.

The thickness of the layers of the reflective laminate may be proportional to, or at least related to, the wavelength of the incident radiation to be reflected, such that the reflected waves from the layers are in phase with one another and superimpose. The thickness of each of the layers may be such that incident electromagnetic radiations that are reflected from the interfaces between the different layers are substantially in phase with each other and superimpose to create an overall high reflectivity for the structure.

In an embodiment of the invention, the combined thickness of a pair of adjacent layers may be approximately half-wavelength thickness (i.e., ½ the wavelength of the incident radiation ($\lambda$), or $\lambda/2$). In an embodiment of the invention, the thickness of each layer of the pair of adjacent layers may be the same and may be approximately quarter-wavelength thickness (i.e., ¼ the wavelength of the incident radiation). In another embodiment of the invention the layers of the pair may have different thickness provided that the total thickness approximately adds up to half-wavelength thickness. For example, one layer containing a material with relatively low absorption for a particular radiation may have thickness of approximately $0.7*(\lambda/2)$ and the other layer with a relatively higher absorption for the particular radiation may have thickness of approximately $0.3*(\lambda/2)$, so that the combined thickness of the pair is ($\lambda/2$), and so that less of the more absorbent material is present. In some embodiments a thicker layer may be desired, for example to make it easier to control the thickness. Good reflection may also be achieved when the combined thickness of a pair of adjacent layers is the sum of an integer multiple of the wavelength (m$\lambda$) plus half-wavelength thickness ($\lambda/2$), or $m\lambda+\lambda/2$, where m is an integer. For example, the thickness of the pair of adjacent layers may be $3\lambda/2$, $5\lambda/2$, $7\lambda/2$, etc.

In an alternate embodiment of the invention, rather than a reflective pair of adjacent layers, an anti-reflective pair of adjacent layers may be desired. In such embodiments, the combined thickness of a pair of adjacent layers may be either quarter-wavelength ($\lambda/4$) thickness or the sum of an integer multiple of the wavelength (m$\lambda$) plus quarter-wavelength thickness ($\lambda/4$). That is, the combined thickness may be $m\lambda+\lambda/4$, where m is an integer.

Non-limiting examples of reflective laminates include but are not limited to Mo/Si, Mo/Be, $Al_2O_3$W, W/C, Mo2C/Si, V/C, Ti/C, W/B4C, $SiO_2$/Si, $Al_2O_3$/$TiO_2$. Mo/Si and Mo/Be have good reflectivity at wavelengths around 10 nm. One exemplary reflector contains 40 alternating pairs of adjacent layers of Mo and Si. The thickness of a pair of adjacent layers may be as previously discussed (e.g., $\lambda/2$). In one aspect, the Mo layers may be approximately 45% of the combined thickness of the pair of adjacent layers and the Si layers may be the remaining 55% of the combined thickness. $Al_2O_3$/W have good reflectivity at shorter wavelengths, for example EUV or SXR. Another exemplary reflector contains 64 alternating pairs of adjacent layers of $Al_2O_3$ and W. The thickness of a pair of adjacent layers may be as previously discussed, for example they may each be approximately 15 Angstroms. Numerous other examples of multi-layer dielectric mirrors and Distributed Bragg Reflectors (DBR) utilizing different materials abound in the literature. Any multi-layer dielectric mirror or DBR discussed in the literature containing at least one material layer that may be deposited by ALD may potentially be used for a reflective laminate for a micro-mechanical device, as described herein. Regardless of the specific materials, the laminate may contain at least two (e.g., $Al_2O_3$/W), at least three ($Al_2O_3$/W/$Al_2O_3$ or W/$Al_2O_3$/W), at least four ($Al_2O_3$/W/$Al_2O_3$/W or W/$Al_2O_3$/W/$Al_2O_3$), at least ten, at least 20, at least 40, or any number of alternating layers. Generally, more layers improve reflectance, at least to a point.

The illustrated micro-mechanical device contains the electrically insulating layer, which is optional. The electrically insulating layer is disposed between the reflector, which may contain an electrically conductive material, and electrical components of the micro-mechanical device, which may carry electrical signals (currents and voltages) associated with the operation of the device. In this way the electrically insulating layer may insulate the reflector from the electrical components to help prevent electrical shorts. The insulating layer may contain a material having a lower dielectric constant, and a higher electrical resistance, compared to a material used in the micro-mechanical device. For example, the insulating layer may have a material with a lower dielectric constant and a higher electrical resistance than silicon, which is a material that is commonly found in MEMS devices. Suitable insulating layer materials include but are not limited to dielectrics, oxide dielectrics, and nitride dielectrics. Specific examples of dielectrics include $Al_2O_3$, $SiO_2$, and $TiO_2$. Again, this may be desired to help insulate the reflector from the surface portions of the device, and help prevent electrical shorts.

The desired thickness of the insulation often depends on the maximum voltage of the device and the insulating properties of the layer. For alumina the present inventors favor using at least approximately 2 nm thickness of alumina per volt used in the device to separate electrically conductive structures or components from one another. For example, in a micro-electromechanical device containing a cantilever beam and a contact electrode a combined thickness of about 20 nm or greater of alumina would be favored to separate the beam and the contact electrode if the device is to run at approximately 10V maximum. If a micro-electromechanical device were designed for CMOS to run at 6V maximum, then a combined alumina thickness of approximately 12 nm, or greater, would be favored. Less insulation may be sufficient, depending upon the objectives of the particular implementation. Thicker layers may be used provided they do not interfere too much with device operation. The insulating layer may be deposited by ALD, in order that it is deposited substantially conformally and with uniform thickness over all surfaces, including out-of-sight surfaces, although this is not required.

In one exemplary implementation, which is described below, a micro-mechanical device containing a reflector for a particular electromagnetic radiation may be used in a lithography system. Lithography is commonly used to manufacture micro-electronic devices. During lithography a radiation sensitive material, such as a resist layer on an integrated circuit substrate, is selectively exposed to radiation. Lithography masks containing radiation opaque and transparent regions are commonly used to pattern radiation for the radiation sensitive material. The selective exposure is used in subsequent processing to create patterns and structures associated with the devices. One problem with prior art lithography systems is that the lithography masks have specific patterns that are not easily changed.

Figure 24:
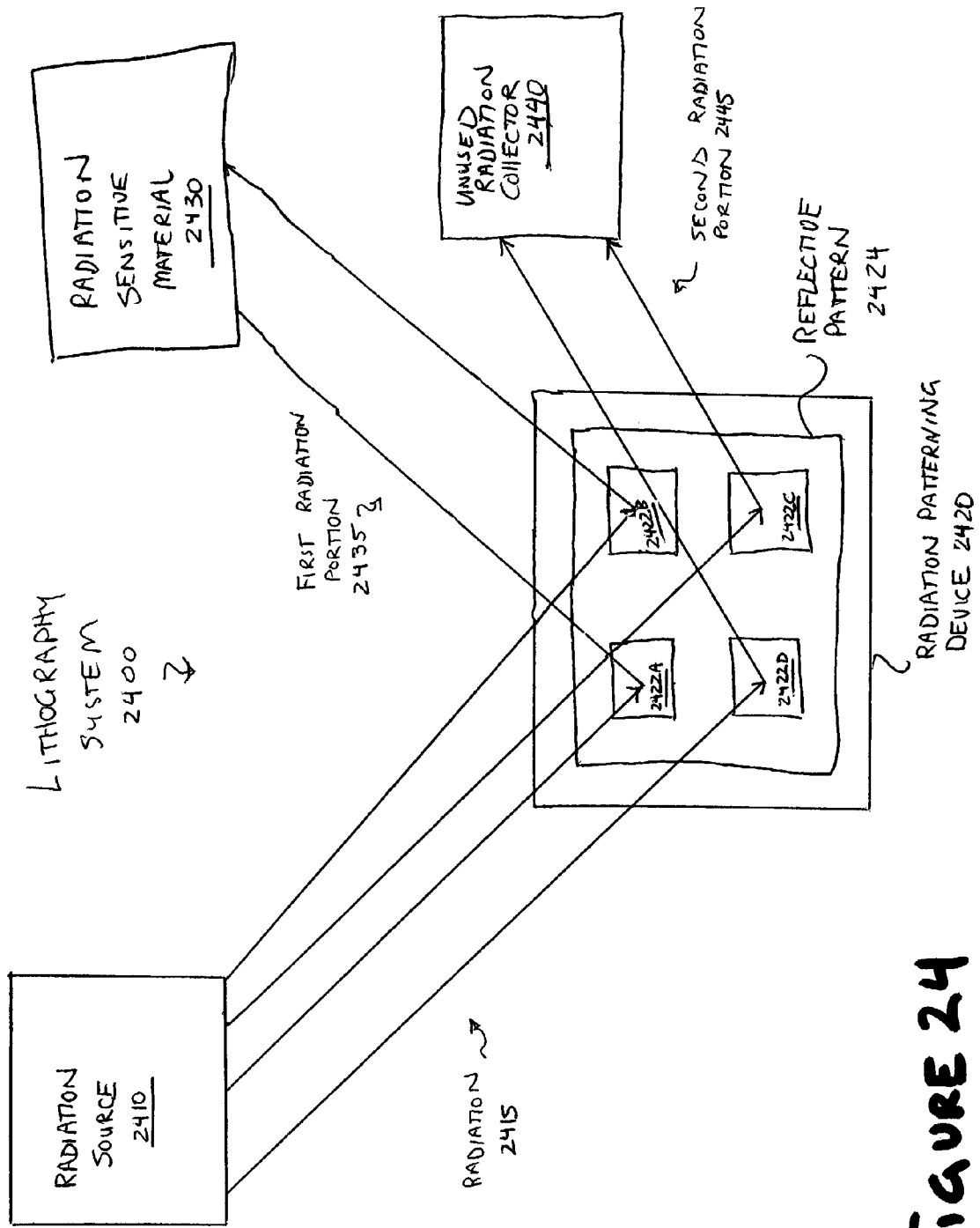
FIG. 24 shows a lithography system containing a radiation source, a radiation patterning device, a radiation sensitive material, and an unused radiation collector, according to an embodiment of the invention.

In one embodiment of the invention, a micro-mechanical device having a reflector for an electromagnetic radiation, such as EUV or SXR radiations, may be incorporated into a lithography system to selectively reflect the radiation to a desired destination, such as a material that is sensitive to the radiation, based on movement of the reflector by the device. FIG. 24 shows a lithography system 2400 containing a radiation source 2410, a radiation patterning device 2420, a radiation sensitive material 2430 (e.g., a resist layer on a micro-electronic device substrate), and an unused radiation collector 2440, according to an embodiment of the invention. Suitable lithography systems in which the radiation patterning device of the invention may be implemented are known in the arts. One suitable lithography system is the maskless lithography system available from SUSS MicroTec of Munich, Germany. The SUSS maskless lithography system uses an array of micromirror devices, instead of masks, to selectively reflect radiation toward a resist. To make it clear, the micromirror devices contain conventional mirrors, which do not contain ALD deposited layers. These micromirrors are not suitable for reflecting EUV and SXR radiations, due to the absorption of these radiations by almost all materials. A radiation patterning device may be used in such a lithography system to reflect EUV and SXR radiations.

The radiation source generates and transmits radiation 2415 toward the radiation patterning device. Suitable radiation sources include but are not limited to arc lamps and excimer lasers. The radiation patterning device contains micro-mechanical devices 2422A-D that collectively form a reflective pattern 2424. To better illustrate the concepts of the invention only four micro-mechanical devices are shown, although it will be appreciated that any desired number may be used, and in an actual implementation many such micro-mechanical devices may be used.

The reflective pattern is used to pattern the radiation 2415 into a first radiation portion 2435 directed toward the radiation sensitive material and a second radiation portion 2445 directed toward the unused radiation collector. The first portion may be used to selectively expose the radiation sensitive material. Each of the micro-mechanical devices may contain a radiation reflector attached to a moveable component thereof. The micro-mechanical device may electrically move the component and thereby move the reflector. As shown, a first 2422A and a second micro-mechanical device 2422B may reflect the first portion 2435 and a third 2422C and a fourth micro-mechanical device 2422D may reflect the second portion 2445. The micro-mechanical device may have at least two configurations for the moveable component, for example one that reflects to the radiation sensitive material and another that reflects to the unused radiation collector. One configuration may effectively transmit radiation to the material, by reflecting the radiation toward the material, and another may effectively block radiation from the material, by reflecting the radiation away from the material. More than two configurations may be supported, as desired. Each micro-mechanical device may correspond or map to a small unit area or location of radiation sensitive material. That unit area or location may be exposed to radiation if its corresponding micro-mechanical device is configured to reflect to the radiation sensitive material and may be unexposed otherwise. After exposure, conventional development and subsequent processing may be used to create micro-electronic devices.

The unused radiation collector collects the second portion. The unused radiation collector may comprise a radiation tolerant surface or object that is able to withstand the radiation. In the case of x-ray radiation the collector may comprise a mass of lead or other dense heavy material sufficient to absorb the unused radiation. In the case of visible radiation the collector may comprise a black surface, a one-way mirror, or the like.

It is an aspect of an embodiment of the invention that the configuration of the plurality of micro-mechanical devices, and therefore the reflective pattern, may be under user specification or control. As an example, the computer system may contain software instructions sufficient to allow a reflective pattern to be specified for, and implemented on, the radiation patterning device. The reflectors of the micro-mechanical devices may be moved into proper configuration, relative to the incident radiation, based on the specified reflective pattern. Advantageously, in this way, the pattern of the radiation patterning device may be easily changed and reconfigured, for example when a change to the pattern is desired. Prior art masks would typically need to be scrapped. This may also allow a single radiation patterning device to contain multiple patterns, which may be used at different stages of a fabrication process, or which may be used on different microelectronic device designs.

Extreme ultraviolet (EUV) and soft x-ray (SXR) radiations are sometimes used for lithography. EUV refers to radiation having wavelength between X-rays and Ultraviolet. As used herein, EUV radiation has wavelengths in the range of approximately 5 nm-50 nm (or photon energies in the range of approximately 30 eV (electron volts)-250 eV). As used herein, SXR refers to radiation having wavelength in the range of approximately 0.1 nm-5 nm (or photon energies in the range of approximately 250 eV-12 keV). Due to their relatively small wavelength, the EUV and SXR radiations allow smaller feature sizes or critical dimensions, compared to radiations that have previously used in the semiconductor processing industries, and are increasingly becoming favored for this reason.

The present inventors have discovered that ALD may be used to form reflectors for EUV and SXR radiations. Materials that have commonly been used for reflection of visible radiation from micro-mirror MEMS include silicon, gold, aluminum, and silver. One problem with these materials is that they absorb EUV and SXR radiations and provide poor reflectivity for such radiations. In fact, few if any materials are reflective to EUV and SXR radiations, due to high atomic resonance absorptions at these wavelengths. Different materials will be needed in order to provide micro-mechanical devices with reflectors for these radiations.

The present inventors contemplate using reflective laminate layers to reflect EUV and/or SXR radiations. At least one, any desired subset, or all of the laminates layers may be deposited by ALD a part of a reflective surface for a MEMS. In an embodiment of the invention, a reflector may contain a reflective laminate, containing one or more ALD layers, that is deposited on a surface of a moveable component of a micro-mechanical device. An electrically insulating layer, for example containing $Al_2O_3$, may be disposed between the reflector and the device, although this is not required.

One exemplary micro-mechanical device comprising a reflector contains an electrically insulating $Al_2O_3$ layer over a released micro-electromechanical mirror device, and a reflective laminate containing at least one reflective $Al_2O_3$/W layer pair over the insulating layer. As previously discussed, a reflective $Al_2O_3$/W laminate may offer good reflectivity to EUV and SXR radiations. The electrically insulating $Al_2O_3$ layer may be deposited over the surface of the device, under the reflective laminate. Initially, a standard electronics package may be prepared with the released device located on a chip at the center of the package. The $Al_2O_3$ layer may be deposited on the device and package using ALD. In one aspect, the thickness of the $Al_2O_3$ layer may be approximately 500 Angstroms. This thickness may provide sufficient electrical insulation up to a voltage of approximately 25 volts. Next, a reflective laminate containing at least one pair of adjacent $Al_2O_3$ and W layers with a combined thickness that is approximately half-wavelength thickness, or an integer multiple of the wavelength plus half-wavelength thickness, may be deposited on the electrically insulating layer by ALD.

As previously discussed, the present inventors have discovered methods for controlling the roughness or smoothness of an ALD layer. It is an aspect of one embodiment of the invention that one or more of these methods be employed when depositing a layer of a radiation reflector so that the ALD layer is smooth, has reduced optical scattering losses, and provides good reflectivity.

Figure 25:
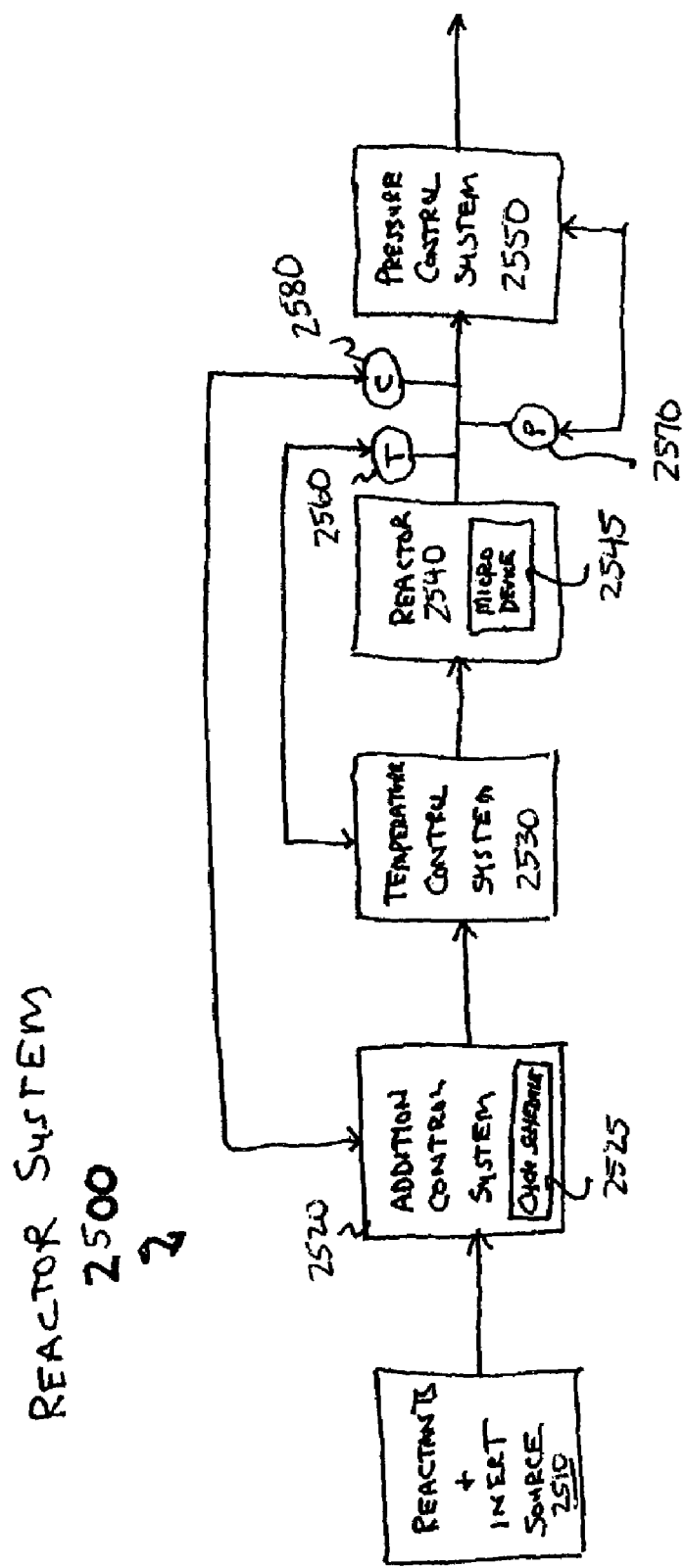
FIG. 25 shows a reaction system, according to one embodiment.

FIG. 25 shows a reaction system 2500 that may be used to deposit layers on micro-mechanical devices by ALD, according to one embodiment. The reactor system includes a reactants and inert source 2510, an addition control system 2520 containing a cycle schedule 2525, a temperature control system 2530, a reactor 2540 containing a micro-device 2545, a pressure control system 2550, a temperature measurement device 2560, a pressure measurement device 2570, and a concentration measurement device 2580. The addition control system controls the addition of reactants and inerts to the reactor based on the cycle scheme and based on concentrations at the outlet of the reactor, as measured by the concentration measurement device. The temperature control system controls the temperature at the outlet of the reactor, as measured by the temperature measurement device. The pressure control system controls the pressure at the outlet of the reactor by controlling the flow out of the reactor.

In conclusion, the present invention provides an approach for depositing a layer of material on a micro-mechanical device by using atomic layer deposition. In the foregoing specification, the invention has been described with reference to specific embodiments thereof. It will, however, be evident that various modifications and changes may be made thereto without departing from the broader spirit and scope of the invention. With respect to the above description then, it is to be realized that the parts of the invention, to include variations in size, materials, shape, form, function and manner of operation, assembly and use, as are deemed readily apparent to one of ordinary skill in the art. All equivalent relationships to those illustrated in the drawings and described in the specification are intended to be encompassed by the present invention. The specification and drawings are, accordingly, to be regarded in an illustrative rather than a restrictive sense.

In the claims that follow, any element that does not explicitly state "means for" performing a specified function, or "step for" performing a specified function, is not to be interpreted as a "means" or "step" clause as specified in 35 U.S.C. Section 112, Paragraph 6. Additionally, any use of "step of" in the claims herein is not intended to invoke the provisions of 35 U.S.C. Section 112, Paragraph 6.

What is claimed is:

1. A method comprising:
providing a micro-mechanical device having dimensions smaller than one millimeter and a moving mechanical component; and
depositing at least one layer over of the micro-mechanical device by atomic layer deposition wherein said layer is deposited by sequentially exposing the micro-mechanical device to a first reactant and a second reactant, and said layer is a reaction product of the first and second reactant.

2. The method of claim 1, wherein said at least one layer is conformal and of substantially uniform thickness layer over all accessible portions of the device including over an out-of-sight portion.

3. The method of claim 1, wherein depositing comprises depositing at a temperature that is less than 200° C.

4. The method of claim 1, wherein at least two layers are deposited over a surface of the micro-mechanical device by atomic layer deposition wherein each said layer is deposited by sequentially exposing the surface to a first reactant and a second reactant, and each said layer is a reaction product of the first and second reactant;
wherein one of said layers is an electrically insulating layer, the electrically insulating layer comprising an electrically insulating material having a dielectric constant less than 10; and
another of said layers is a biocompatible layer over the electrically insulating layer comprising a material that is selected from the group consisting of titanium, titanium nitride, titanium dioxide, silicon dioxide, aluminum oxide, and tantalum nitride.

5. A micro-mechanical device having one or more layers deposited thereon by the method of claim 1.

6. The method of claim 4, wherein the electrically insulating layer comprises aluminum oxide.

7. The method of claim 6, wherein the biocompatible layer comprises titanium dioxide.

8. The method of claim 7, wherein the titanium dioxide layer is deposited by sequentially exposing the micro-mechanical device to tetrachlorotitanium and water.

9. The method of claim 7, wherein a thickness of the electrically insulating layer is about 0.1 microns, or larger, and wherein a thickness of the biocompatible layer is about 0.02 microns, or larger.

10. The method of claim 4, wherein the electrically insulating layer is sufficiently thick to prevent a voltage associated with the device from hydrolyzing water in a fluid in which the device is to be employed.

11. The method of claim 4, wherein the biocompatible layer comprises a material that is selected from the group consisting of titanium, titanium nitride, titanium dioxide, silicon dioxide, aluminum oxide, and tantalum nitride.

12. A micro-mechanical device having dimensions smaller than one millimeter and a moving mechanical component comprising
a first layer over at least a portion of the micro-mechanical device; and
a second layer over the first layer;
wherein the first layer includes a first material and the second layer includes a second material that is different than the first material; and
wherein the first and second materials are conformal and substantially uniform in thickness over different portions of the micro-mechanical device including over an out-of-sight portion of the micro-mechanical device.

13. The device of claim 12:
wherein the device comprises a released micro-mechanical device having a surface; and
wherein first layer overlies the surface.

14. The micro-mechanical device of claim 12, wherein the first layer comprises an electrically insulating layer, wherein the first material comprises an electrically insulating material, wherein the electrically insulating material has a dielectric constant that is less than 10, and wherein the second layer comprises a biocompatible layer.

15. The micromechanical device of claim 14, wherein the second material comprises a biocompatible material that is selected from the group consisting of titanium, titanium nitride, titanium dioxide, silicon dioxide, aluminum oxide, and tantalum nitride.

* * * * *